US010199363B2

(12) United States Patent
Tsukada et al.

(10) Patent No.: US 10,199,363 B2
(45) Date of Patent: Feb. 5, 2019

(54) SEMICONDUCTOR MEMORY DEVICE INCLUDING OUTPUT BUFFER

(71) Applicant: Micron Technology, Inc., Boise, ID (US)

(72) Inventors: Wataru Tsukada, Sagamihara (JP); Masayuki Honda, Machida (JP); Yoshihisa Fukushima, Hachioji (JP); Scott Richard Cyr, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 69 days.

(21) Appl. No.: 15/600,526

(22) Filed: May 19, 2017

(65) Prior Publication Data
US 2017/0256527 A1 Sep. 7, 2017

Related U.S. Application Data

(63) Continuation of application No. 14/839,771, filed on Aug. 28, 2015, now Pat. No. 9,691,744.

(30) Foreign Application Priority Data

Aug. 29, 2014 (JP) .................................. 2014-175787

(51) Int. Cl.
H01L 23/538 (2006.01)
H01L 25/18 (2006.01)
H01L 25/065 (2006.01)
G11C 5/04 (2006.01)
G11C 5/06 (2006.01)
G11C 29/02 (2006.01)
G11C 29/50 (2006.01)
G11C 7/10 (2006.01)

(52) U.S. Cl.
CPC ................ *H01L 25/18* (2013.01); *G11C 5/04* (2013.01); *G11C 5/063* (2013.01); *G11C 29/025* (2013.01); *G11C 29/50008* (2013.01); *H01L 25/0655* (2013.01); *G11C 7/1048* (2013.01); *G11C 2207/105* (2013.01); *H01L 23/5386* (2013.01); *H01L 2924/0002* (2013.01)

(58) Field of Classification Search
None
See application file for complete search history.

(56) References Cited

U.S. PATENT DOCUMENTS 7,440,289 B2 * 10/2008 Sugano .................... G11C 5/00
 361/749
7,745,915 B2 * 6/2010 Suwa .................. H01L 23/5386
 257/678
7,919,841 B2 * 4/2011 Park ..................... H05K 1/0246
 257/777
9,691,744 B2 6/2017 Tsukada et al.
(Continued)

FOREIGN PATENT DOCUMENTS

JP 2004-062530 2/2004

*Primary Examiner* — Chandra Chaudhari
(74) *Attorney, Agent, or Firm* — Dorsey & Whitney LLP

(57) ABSTRACT

A semiconductor module includes a module substrate, a line pattern provided to the module substrate, first and second semiconductor chips on the module substrate and coupled to the line pattern, and a termination resister on the module substrate and coupled to the line pattern, the termination resistor being located between the first and second semiconductor chips.

21 Claims, 33 Drawing Sheets

(56) References Cited

U.S. PATENT DOCUMENTS

2004/0019758 A1    1/2004   Shibata et al.
2009/0127716 A1    5/2009   Takatsuki
2016/0064366 A1    3/2016   Tsukada et al.

* cited by examiner

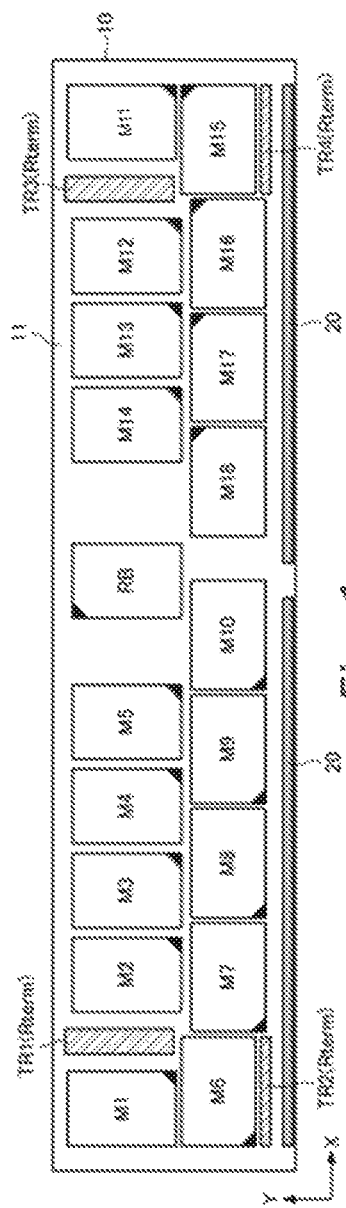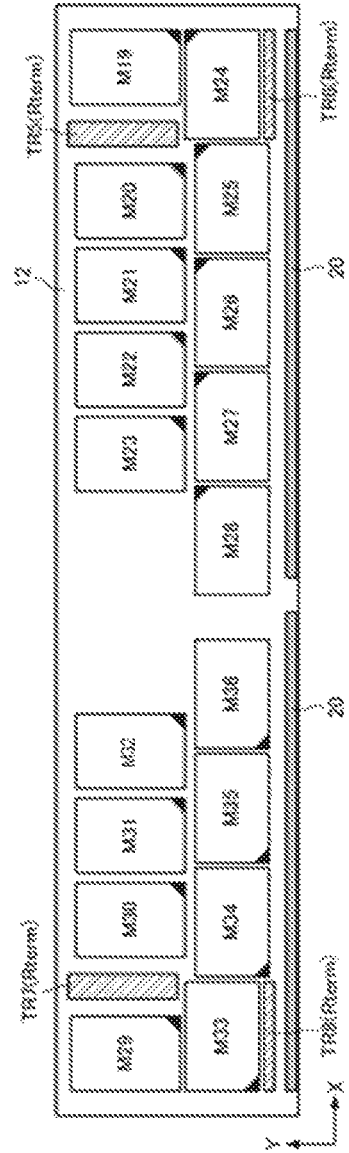

SEMICONDUCTOR MEMORY DEVICE INCLUDING OUTPUT BUFFER

CROSS-REFERENCE TO RELATED APPLICATION(S)

This application is a continuation of Ser. No. 14/839,771 filed on Aug. 28, 2015, which application is based upon and claims the benefit of priority from Japanese Patent Application No. 2014-175787 filed on Aug. 29, 2014, the disclosures of which are incorporated herein in their entirety by reference.

FIELD OF THE PRESENT INVENTION

The present invention relates to a semiconductor module, in particular, relates to a semiconductor module mounting a plurality of semiconductor chips on a module substrate.

DESCRIPTION OF THE PRIOR ART

A semiconductor module such as a memory module includes a plurality of semiconductor chips mounted on a module substrate. See JP 2004-62530A1. For example, a memory module called Registered DIMM (RDIMM) has a register chip which receives address signals and command signals supplied from outside. The register chip outputs the address signals and the command signals in common to a plurality of Dynamic Random Access Memories (DRAMs) via a wiring pattern on the module substrate.

On the contrary, a termination resistor is provided to an end of the wiring pattern in order to prevent reflection of the signals at the end. The termination resistor is mounted in the vicinity of an end of the module substrate.

BRIEF DESCRIPTION OF THE DRAWINGS

FIGS. 1a and 1b are plan views showing a semiconductor module according to an embodiment of the present invention, FIG. 1a is a drawing viewed from a first principal surface side, and FIG. 1b is a drawing viewed from a second principal surface side;

FIG. 30a is a table showing an example of parameters for calculating an optimum resistance value of a termination resistor Rterm, and FIG. 30b is a table showing the values of the resistance value Rterm obtained;

DETAILED DESCRIPTION OF THE EMBODIMENTS

Figure 2:
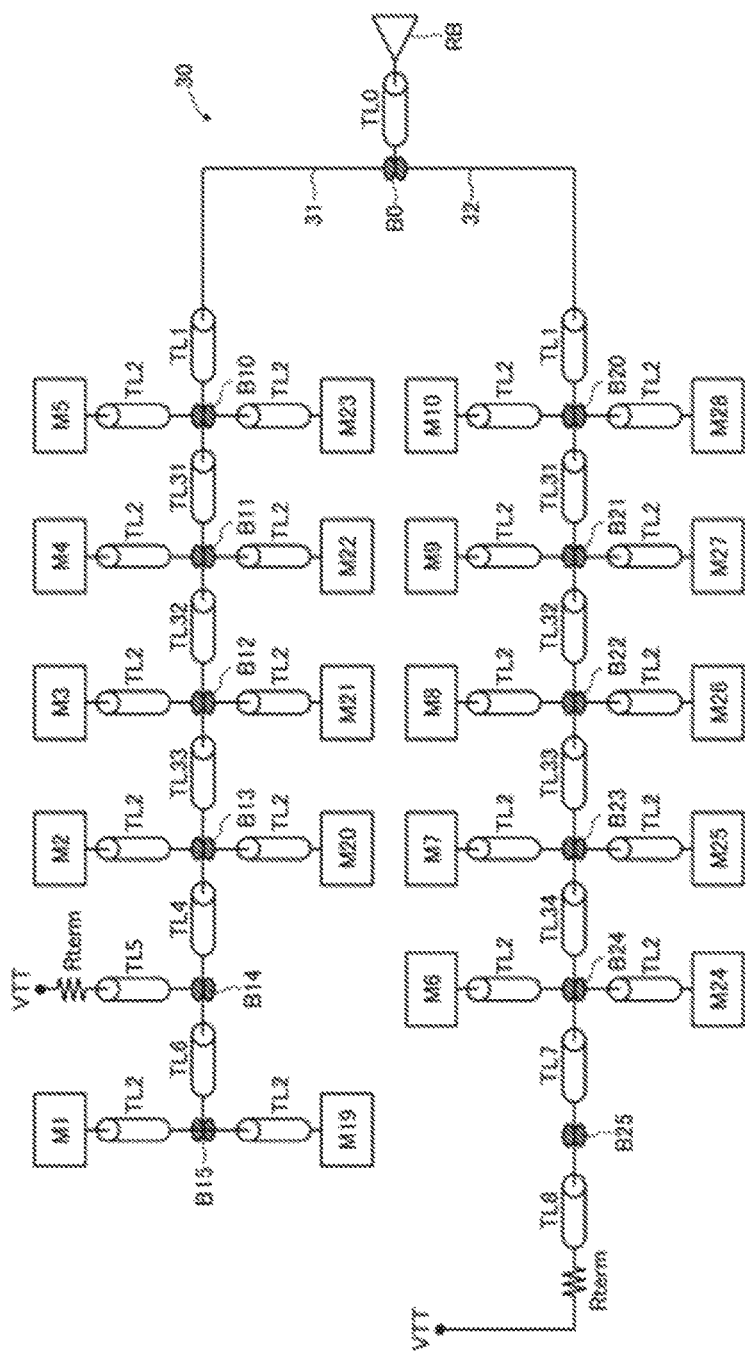
FIG. 2 is a circuit diagram for explaining the connections of a register chip and semiconductor chips.

FIGS. 1a and 1b are plan views showing a semiconductor module according to an embodiment of the present invention. FIG. 1a is a drawing viewed from a first principal surface side, and FIG. 1b is a drawing viewed from a second principal surface side.

The semiconductor module includes semiconductor chips M1 to M36 and one register chip RB mounted on a module substrate 10. The semiconductor chips M1 to M36 are not particularly limited to, but are DRAMs. The module substrate 10 is a rectangular substrate using an X-direction as a longitudinal direction, the semiconductor chips M1 to M18 and the register chip RB are mounted on a first principal surface 11 thereof, and the semiconductor chips M19 to M36 are mounted on a second principal surface 12.

In more detailed explanations, on the first principal surface 11 of the module substrate 10, the register chip RB is mounted on an approximately central portion in the X-direction, the semiconductor chips M1 to M10 are mounted in a first side (left side) viewed from the register chip RB, and the semiconductor chips M11 to M18 are mounted in a second side (right side) viewed from the register chip RB. These semiconductor chips M1 to M18 are arranged in two levels in a Y-direction, the semiconductor chips M1 to M5 and M11 to M14 are arranged in the X-direction in a first row (upper level), and the semiconductor chips M6 to M10 and M15 to M18 are arranged in the X-direction in a second row (lower level). The lower level refers to the side close to a plurality of external terminals 20, which are provided along a long side of the module substrate 10.

The semiconductor chips M19 to M36 mounted on the second principal surface 12 of the module substrate 10 are mounted at the positions respectively overlapped with the above described semiconductor chips M1 to M18 in a planar view. Therefore, the semiconductor chips M19 to M23 and M29 to M32 are arranged in the X-direction in a first row (upper level), and the semiconductor chips M24 to M28 and M33 to M36 are arranged in the X-direction in a second row (lower level).

The planar shapes of the semiconductor chips M1 to M36 are oblong. The semiconductor chips in the first row (upper level) are vertical, in other words, are disposed so that the long sides thereof are directed toward the Y-direction, and the semiconductor chips in the second row (lower level) are horizontal, in other words, are disposed so that the long sides thereof are directed toward the X-direction. In this manner, the semiconductor chips mounted in the upper level and the semiconductor chips mounted in the lower level have mounting directions which are mutually different by 90°.

The plurality of external terminals 20 include command/address terminals to which address signals, command signals, etc. are input and data terminals which input/output data. The address signals and command signals input is the commands address terminals are once input to the register chip RB. The register chip RB buffers the input address signals and command signals and supplies them in common to the semiconductor chips M1 to M36 via a wiring pattern provided on the module substrate 10. In other words, the address signals and the command signals are input in common to the semiconductor chips M1 to M36.

On the other hand, part or all of the data output from the semiconductor chips M1 to M36 are output to outside via mutually different data terminals. Similarly, part or all of the data input from outside are supplied to the semiconductor chips M1 to M36 via mutually different data terminals. The present embodiment is not particularly limited to but does not provide register buffers or the like between the semiconductor chips M1 to M36 and the data terminals.

The module substrate 10 has mount regions TR1 to TR8 in which termination resistors Rterm are mounted. The termination resistor Rterm include extremely small chip parts and are used for terminating the address signals and the command signals output from the register chip RB. In the present embodiment, the mount region TR1 is disposed between the semiconductor chips M1 and M2, the mount region TR2 is disposed between the semiconductor chip M6 and the external terminal 20, the mount region TR3 is disposed between the semiconductor chips M1 and M12, and the mount region TR4 is disposed between the semiconductor chip M15 and the external terminal 20. Meanwhile, on the second principal surface 12, the mount regions TR5 to TR8 are disposed at the positions overlapped with the mount regions TR1 to TR4 in the planar view.

Since the termination resistors Rterm include extremely-small-sized chip parts, the joint strength thereof with respect to the module substrate 10 is lower than that of the semiconductor chips M1 to M36, and the risk of detachment is high in a case of contact upon handling, etc. Such a problem is particularly notable at the termination resistors Rterm in the upper level, which are readily contacted upon handling.

However, since the mount regions TR1, TR3, TR5, and TR7 positioned in the upper level are positioned not at ends of the module substrate 10, but at the parts sandwiched by the two semiconductor chips, the risk of contact with the chip parts upon handling is low. This is for a reason that the heights of the chip parts of the termination resistors Rterm are lower than the heights of the semiconductor chips in addition to the fact that they are distant from the vicinities of the short sides which mainly serve as contact parts upon handling.

FIG. 2 is a circuit diagram for explaining the connections of the register chip RB and the semiconductor chips M1 to M10 and M19 to M28. Since the connections of the register chip RB and the semiconductor chips M11 to M18 and M29 to M36 are almost the same, redundant explanations are omitted.

The address signals and command signals output from the register chip RB are supplied in common to the semiconductor chips M1 to M10 and M19 to M28 via a wiring pattern 30. The same address signals and command signals are supplied also to the other semiconductor chips M11 to M18 and M29 to M36, but illustration thereof is omitted.

The wiring pattern 30 first branches into wiring parts 31 and 32 at a branching point B0. The part between the register chip RH and the branching point B0 includes a wiring part TL0 provided in an inner layer or at a principal surface of the module substrate 10. The length of the wiring part TL0 is, for example, 3.3 mm. The wiring part 31 is connected to the semiconductor chips M1 to M5 and M19 to M23 disposed in the upper level, and the wiring part 32 is connected to the semiconductor chips M6 to M10 and M24 to M28 disposed in the lower level.

The wiring part 31 branches at branching points B10 to B15 and are connected to the semiconductor chips M1 to M5 and M19 to M23, respectively.

The branching point B10 is connected to the branching point B0 via a wiring part TL1 and is connected to the semiconductor chips M5 and M23 via wiring parts TL2. The wiring part TL1 is provided in the inner layer of the module substrate 10, and the length thereof is, for example, 20 mm. On the other hand, the wiring part TL2 is provided on the principal surface 11 or 12, which is a surface layer of the module substrate 10, and length thereof is, for example, 3 mm.

The branching point B11 is connected to the branching point B10 via a wiring part TL31 and is connected to the semiconductor chips M4 and M22 via wiring parts TL2. The wiring part TL31 is provided in the inner layer of the module substrate 10, and the length thereof is, for example, 23 mm.

The branching point B12 is connected to the branching point B11 via a wiring part TL32 and is connected to the semiconductor chips M3 and M21 via wiring parts TL2. The wiring part TL32 is provided in the inner layer of the module substrate 10, and the length thereof is, for example, 18 mm.

The branching point B13 is connected to the branching point B12 via a wiring part TL33 and is connected to the semiconductor chips M2 and M20 via wiring parts TL2. The wiring part TL33 is provided in the inner layer of the module substrate 10, and the length thereof is, for example, 18 mm.

The branching point B14 is connected to the branching point B13 via a wiring part TL4 and is connected to a first end of the termination resistor Rterm via a wiring part TL5. A terminal power source VTT is supplied to a second end of the termination resistor Rterm. The wiring part TL4 is provided in the inner layer of the module substrate 10, and the length thereof is preferred to be 21 mm or less. The wiring part TL5 is provided in the surface layer of the module substrate 10, and the length thereof is preferred to be 21 mm or less.

The branching point B15 is connected to the branching point B14 via a wiring part TL6 and is connected to the semiconductor chips M1 and M19 via wiring parts TL2. The wiring part TL6 is provided in the inner layer of the module substrate 10, and the length thereof is preferred to be shorter than that of the wiring part TL4 and is particularly preferred to be 6 mm or less. The sum of the lengths of the wiring parts TL4 and TL6 is preferred to be longer than the wiring part TL5.

The termination resistor Rterm is connected to the wiring part 31. The termination resistor Rterm is not connected to a terminal portion (part) or an end portion of the wiring part 31, but to the part branched from the wiring parts TL4 and TL6 connecting the semiconductor chips M1 and M2 (M19 and M20). Therefore, the resistance value of the termination resistor Rterm may be required to be a value different from that of a prior case in which it is connected to the terminal or end portion. Furthermore, the lengths and interrelations of the wiring parts TL4 to TL6, etc., which are close to the termination resistor Rterm also may have to be designed in consideration of the above described topology.

On the other hand, the wiring part 32 branches at branching points B20 to B24 and are connected to the semiconductor chips M6 to M10 and M24 to M28, respectively.

The branching point B20 is connected to the branching point B0 via a wiring part TL1 and is connected to the semiconductor chips M10 and M28 via wiring parts TL2.

The branching point B21 is connected to the branching point B20 via the wiring part TL31 and is connected to the semiconductor chips M9 and M27 via wiring parts TL2.

The branching point B22 is connected to the branching point B21 via a wiring part TL32 and is connected to the semiconductor chips M8 and M26 via wiring parts TL2.

The branching point B23 is connected to the branching point B22 via a wiring part TL33 and is connected to the semiconductor chips M7 and M25 via wiring parts TL2.

The branching point B24 is connected to the branching point B23 via to wiring part TL34 and is connected to the semiconductor chips M6 and M24 via wiring parts TL2. The wiring part TL34 is provided in the inner layer of the module substrate 10, and the length thereof is, for example 18 mm.

The branching point B24 is connected to a connecting point B25 via a wiring part TL7, and the connecting point B25 is connected to the termination resistor Rterm via a wiring part TL8. The wiring part TL7 is provided in the inner layer of the module substrate 10, and the length thereof is, for example, 12 mm. The wiring part TL8 is provided in the surface layer of the module substrate 10, and the length thereof is, for example, 1 mm.

In this manner, the termination resistor Rterm is connected to a terminal portion (part) or an end portion of the wiring part 32.

Next, a multi-layer wiring structure formed in the surface layer and the inner layer of the module substrate 10 will be explained.

FIG. 3 to FIG. 14 are schematic drawings respectively showing wiring layers formed in the surface layer or the inner layer of the module substrate 10. All of FIG. 3 to FIG. 14 show the structures viewed from the first principal surface 11 side of the module substrate 10 and therefore transparently illustrate the wiring layers positioned in the back surface viewed from the first principal surface 11.

Figure 3:
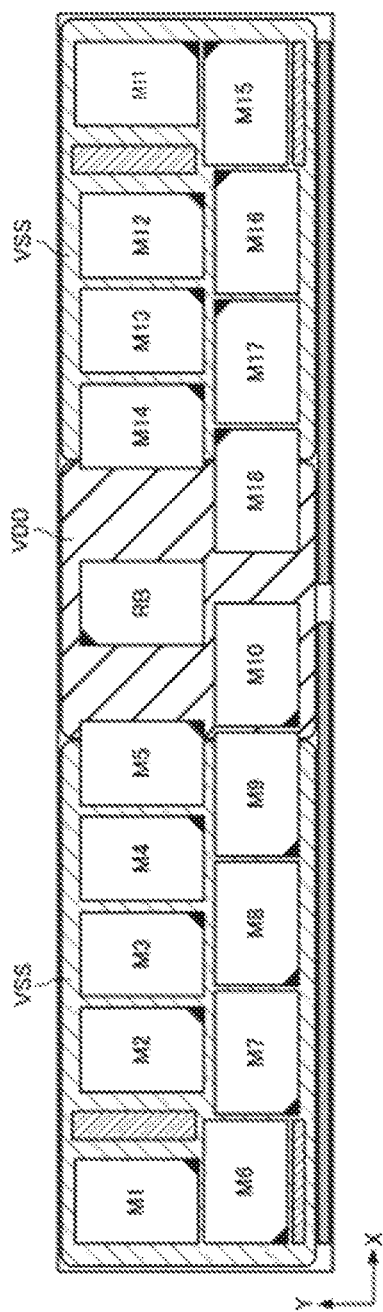
FIG. 3 is a schematic diagram showing a wiring layer provided on a first principal surface, which is an uppermost layer.

As shown in FIG. 3, in the wiring layer provided on the first principal surface 11, which is an uppermost layer, a VDD pattern is disposed at an approximately central part, and VSS patterns are disposed in both sides thereof. The VDD pattern is a power source pattern to which a power-source potential VDD of a high-potential side is supplied via the external terminal 20. The VSS patterns are power source patterns to which a ground potential VSS is supplied via the external terminals 20.

Figure 4:
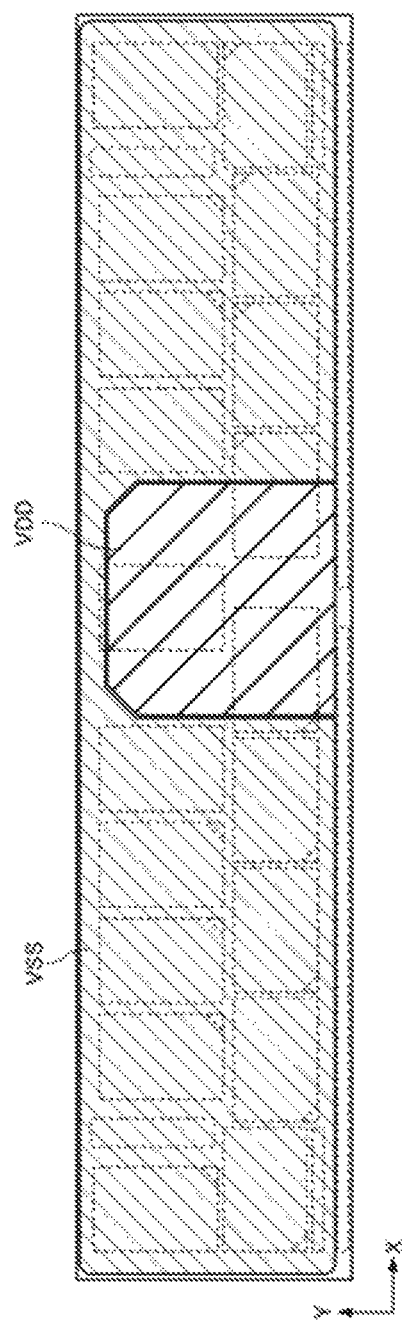
FIG. 4 is a schematic diagram showing a wiring layer provided in a second layer.

As shown in FIG. 4, in the wiring layer provided in a second layer a VDD pattern is disposed in an approximately central part, and VSS patterns are disposed in both sides thereof. The VDD pattern provided in the second layer is connected to the VDD pattern of the principal surface 11 via a through-hole conductor. Similarly, the VSS patterns provided in the second layer are connected to the VSS patterns of the principal surface 11 via through-hole conductors.

Figure 5:
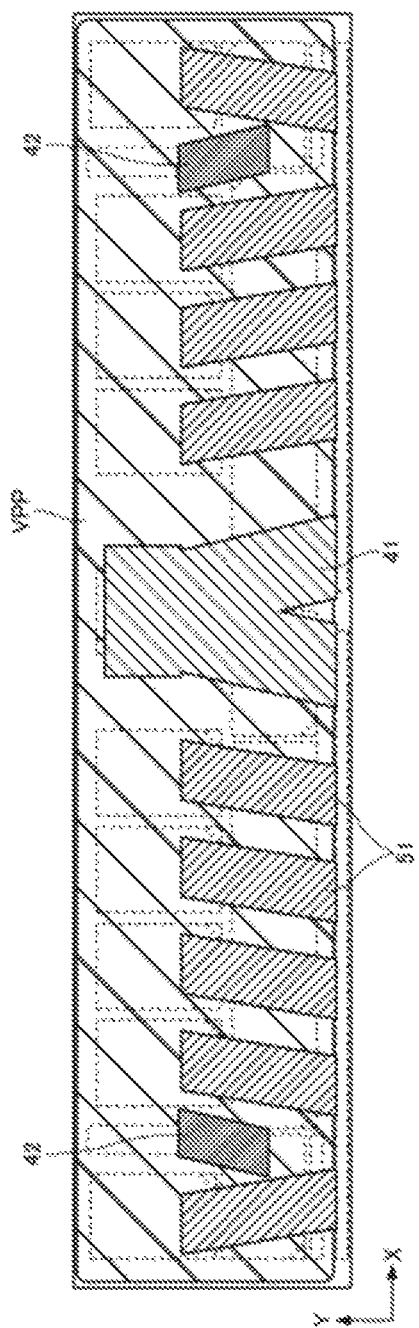
FIG. 5 is a schematic diagram showing a wiring layer provided in a third layer.

As shown in FIG. 5, mainly a VPP pattern is disposed in the wiring layer provided in a third layer and wiring patterns 41 and 42 for address signals and command signals and wiring patterns 51 for data are provided in the regions in which the VPP pattern is not disposed. The VPP pattern is a power source pattern to which a voltage-increasing potential VPP is supplied via the external terminal 20. The wiring pattern 41 is used for supplying the address signals, command signals, etc., which are input via the external terminals 20, to the register chip RB. The wiring patterns 42 are part of the wiring part TL7 shown in FIG. 2. Furthermore, the wiring patterns 51 are used for connecting the semiconductor chips M1 to M5, M11 to M14, M19 to M23, and M29 to M32 disposed in the upper level and data terminals.

Figure 6:
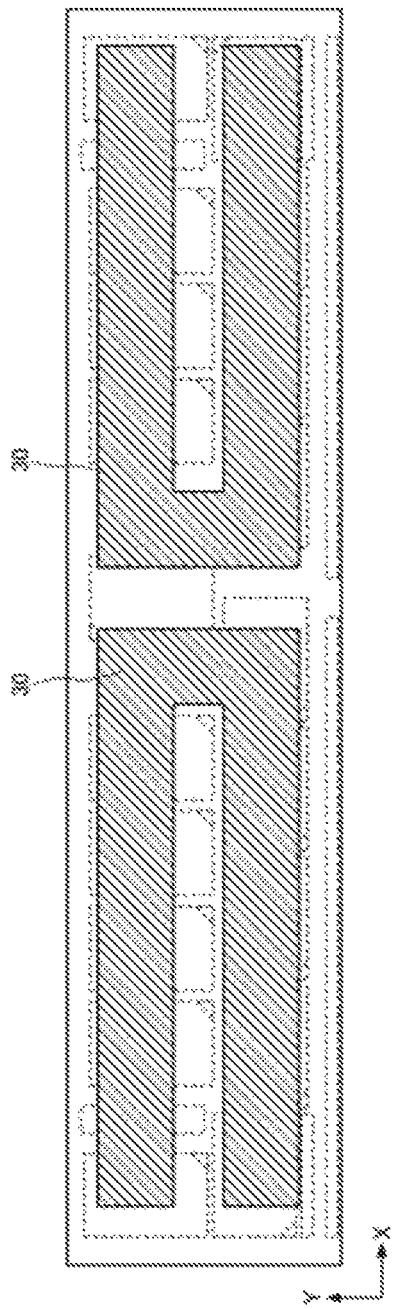
FIG. 6 is a schematic diagram showing a wiring layer provided in a fourth layer.

As shown in FIG. 6, in the wiring layer provided in a fourth layer, part of the wiring patterns 30 for address signals and command signals is provided. The wiring patterns 30 are wiring for supplying the address signals and command signals, which are output from the register chip RB, to the semiconductor chips M1 to M36 as described above. The rest part of the wiring patterns 30 is provided in a sixth layer shown in FIG. 8, a seventh layer shown in FIG. 9, and a ninth layer shown in FIG. 11.

Figure 7:
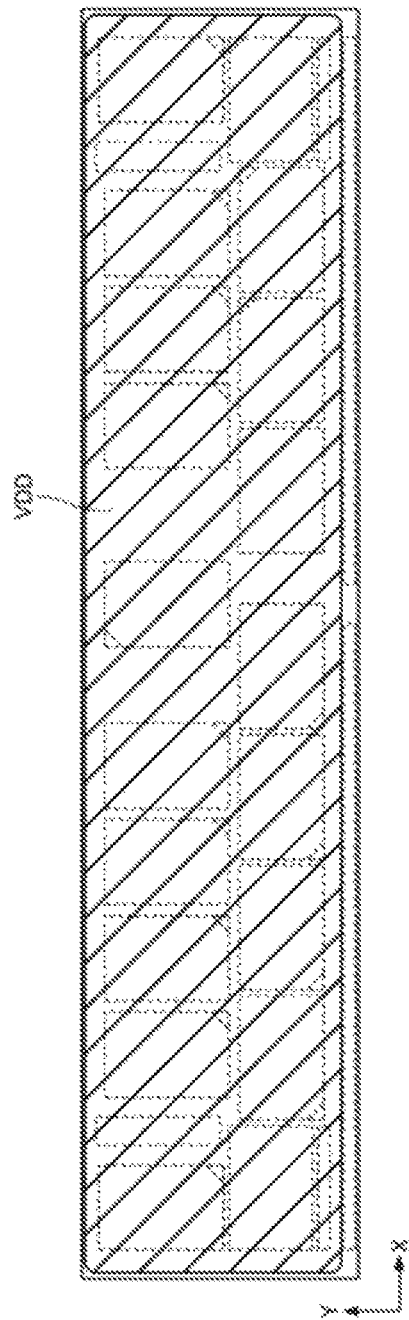
FIG. 7 is a schematic diagram showing a wiring layer provided in a fifth layer.
Figure 8:
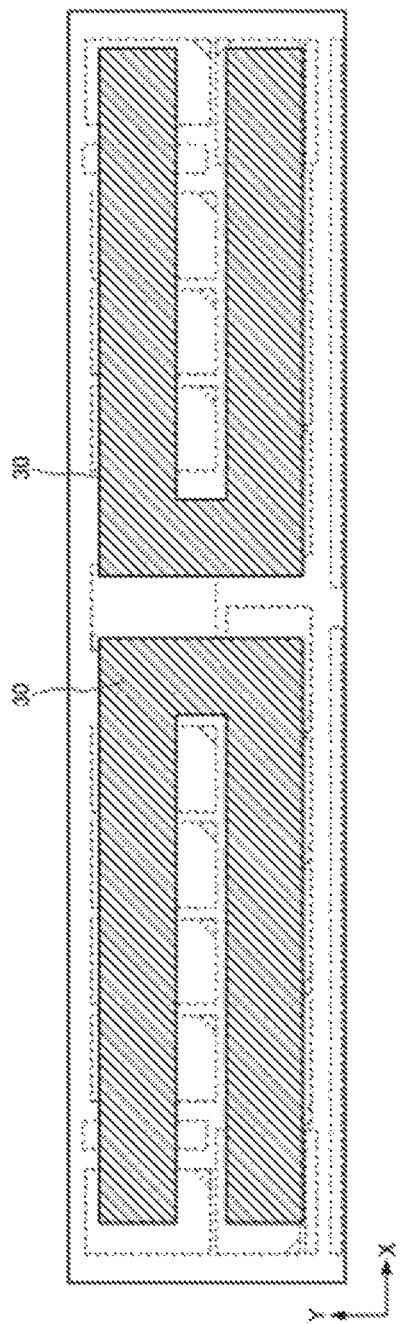
FIG. 8 is a schematic diagram showing a wiring layer provided in a sixth layer.
Figure 9:
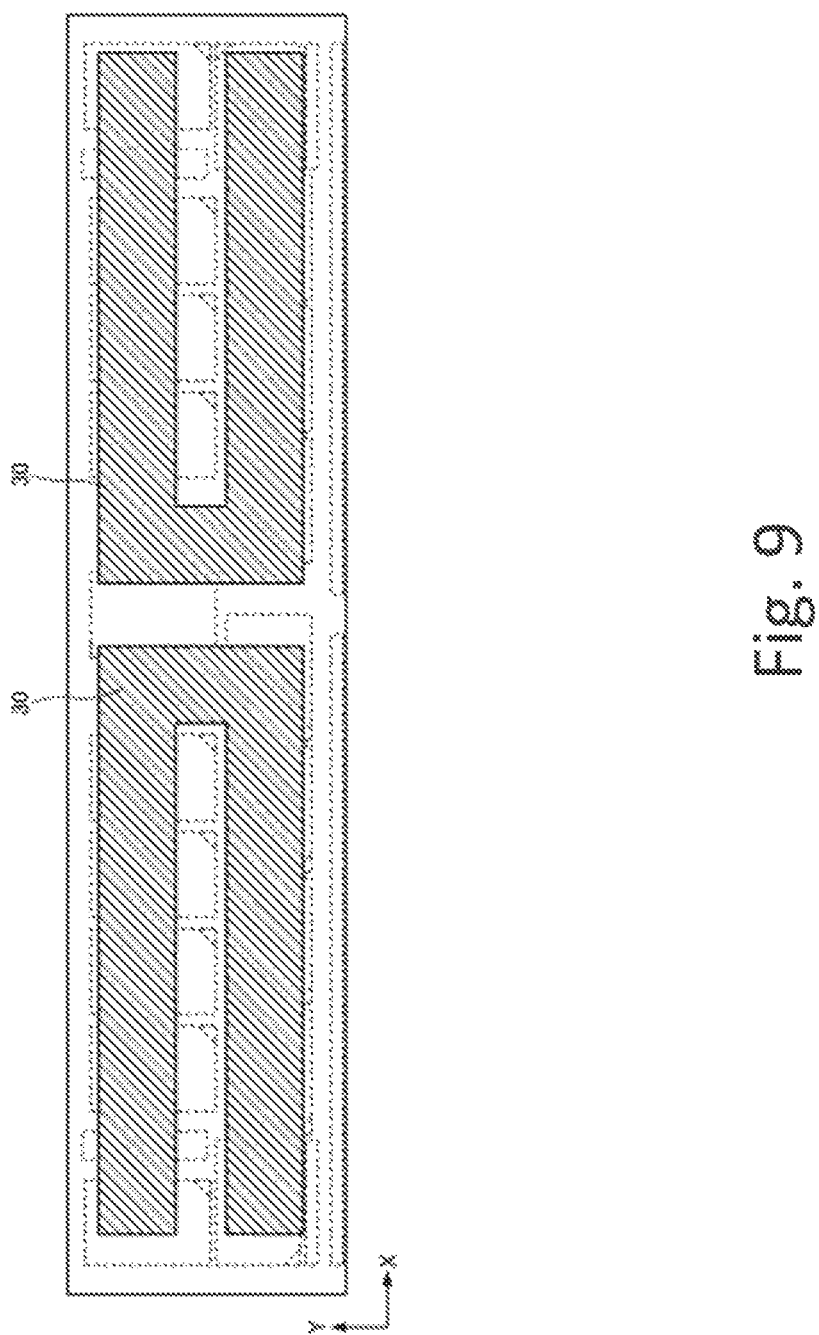
FIG. 9 is a schematic diagram showing a wiring layer provided in a seventh layer.
Figure 10:
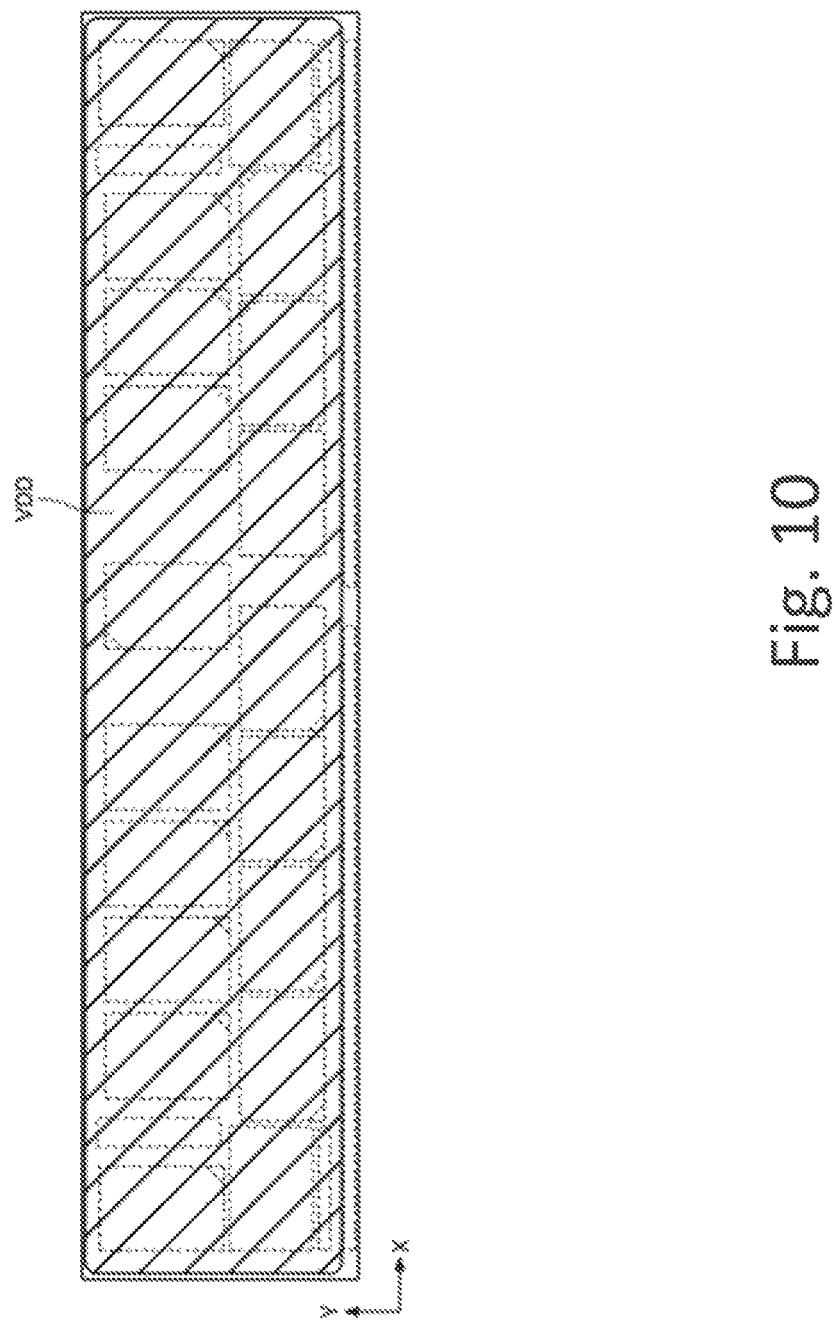
FIG. 10 is a schematic diagram showing a wiring layer provided in an eighth layer.
Figure 11:
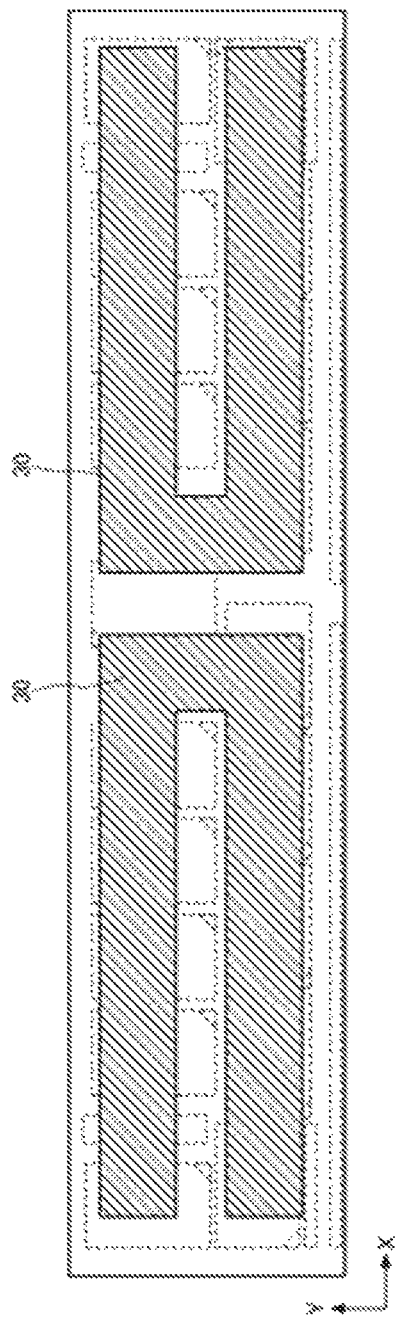
FIG. 11 is a schematic diagram showing a wiring layer provided in a ninth layer.

As shown in FIG. 7 and FIG. 10, VDD patterns are provided in the wiring layers provided in a fifth layer and an eighth layer. A reason why the VDD patterns are provided in the fifth layer and the eighth layer is that the address signals, the command signals, etc. which transmit through the wiring patterns 30 are the signals using the power-source potential VDD as a reference.

Figure 12:
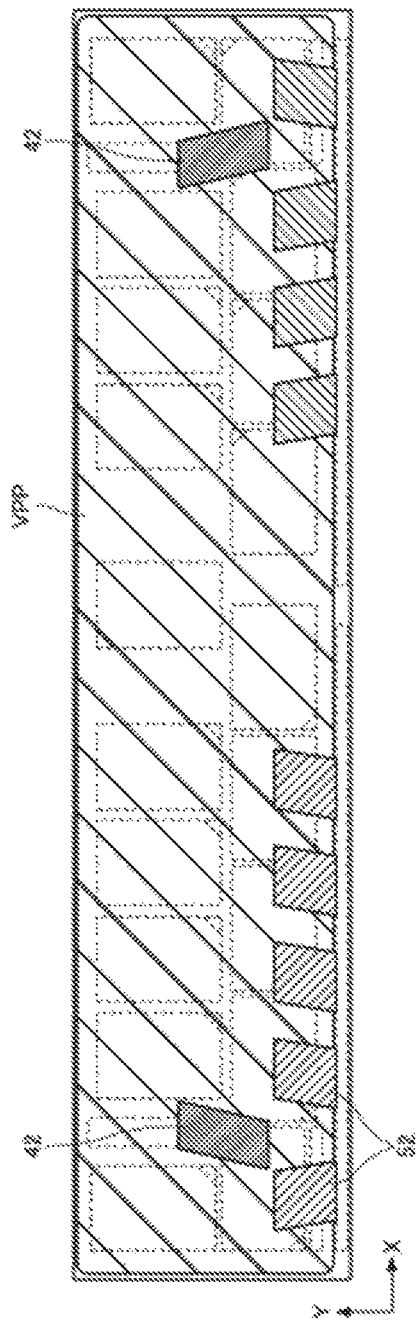
FIG. 12 is a schematic diagram showing a wiring layer provided in a tenth layer.

As shown in FIG. 12, mainly a VPP pattern is disposed in the wiring layer provided in a tenth layer, and wiring patterns 42 for address signals and command signals and wiring patterns 52 for data are provided in the regions in which the VPP pattern is not disposed. The wiring patterns 52 are used for connecting the semiconductor chips M6 to M10, M15 to M18, M24 to M28, and M33 to M36 disposed in the lower level and data terminals.

Figure 13:
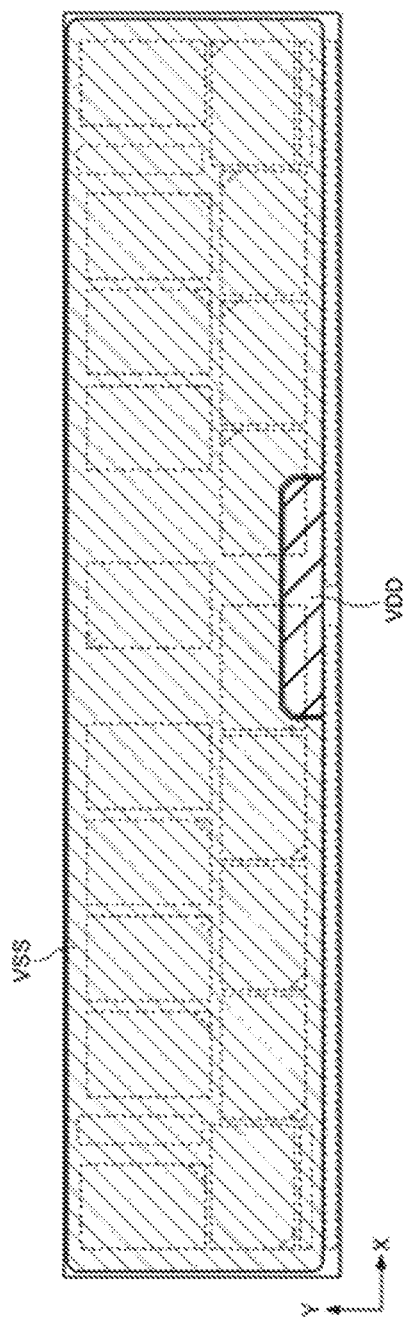
FIG. 13 is a schematic diagram showing a wiring layer provided in an eleventh layer.

As shown in FIG. 13, in the wiring layer provided in an eleventh layer, as well as the second layer, a VDD pattern is disposed in an approximately central part, and a VSS pattern is disposed in both sides thereof.

Figure 14:
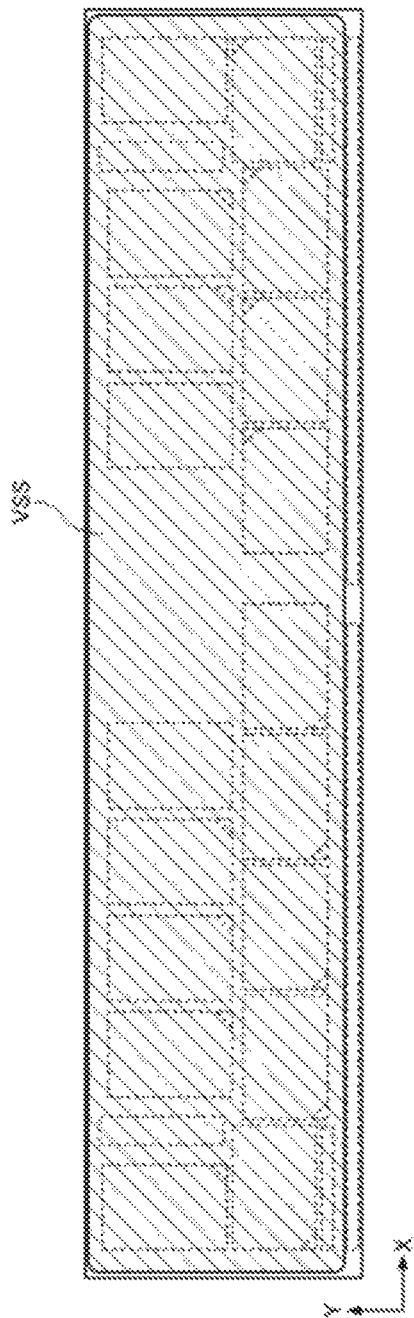
FIG. 14 is a schematic diagram showing a wiring layer provided on a second principal surface, which is a lowermost layer.

Then, as shown in FIG. 14, in the wiring layer provided on the second principal surface 12, which is a lowermost layer, a VSS pattern is disposed. The VSS pattern provided in the lowermost layer is connected to the VSS pattern of the eleventh layer via a through-hole conductor.

Hereinabove, the multi-layer wiring structure of the module substrate 10 has been described.

Figure 15:
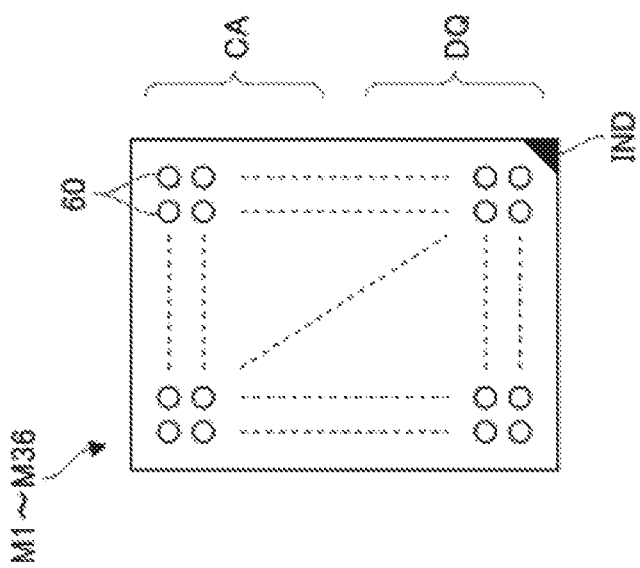
FIG. 15 is a schematic diagram showing a layout of terminal electrodes provided on each of the semiconductor chips.

FIG. 15 is a schematic diagram showing a layout of terminal electrodes provided on the semiconductor chips M1 to M36.

As shown in FIG. 15 a plurality of terminal electrodes 60 are laid out like a matrix on the back surfaces of the semiconductor chips M1 to M36. The plurality of terminal electrodes 60 include command/address terminals CA for inputting address signals, command signals, etc. and data terminals DQ for inputting/outputting data. In addition to that, many power-source terminals, etc. may be included. The data terminals DQ are disposed in a first side of the long-side direction and in the side with an index IND. The command/address terminals CA are disposed in a second side of the long-side direction and in the side without the index IND.

Figure 16:
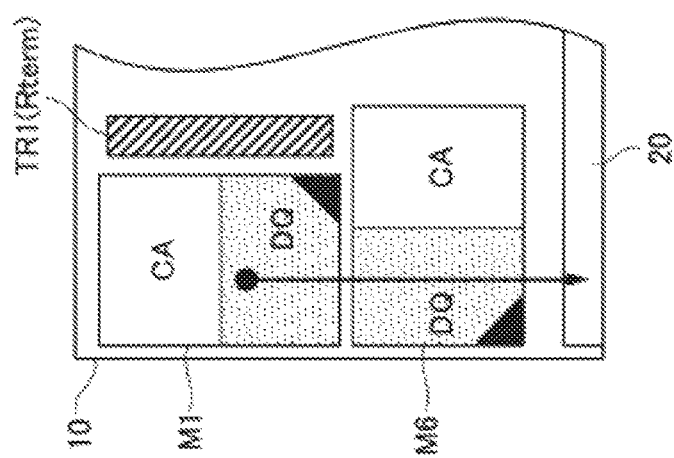
FIG. 16 is a schematic diagram for explaining the distance between data terminals and an external terminal in the present embodiment.
Figure 17:
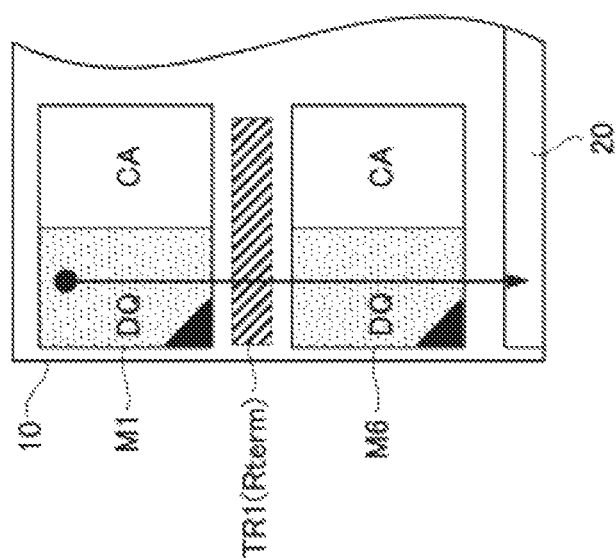
FIG. 17 is a schematic drawing for explaining the distance between data terminals and an external terminal in a reference example.

As a result, as shown in FIG. 16, which is a schematic diagram, the distance between the data terminals DQ (shaded regions) of each of the semiconductor chips M1 to M5, M11 to M14, M19 to M23, and M29 to M32 disposed in the upper level and the external terminal 20 is shortened, and signal quality of data can be therefore increased. On the other hand, in the case of a layout according to a reference example shown in FIG. 17, the effect of preventing detachment of the chip parts of the termination resistor Rterm can be obtained by some degree. However, since the distances between the data terminals DQ (shaded regions) of the semiconductor chips M1 to M5, M11 to M14, M19 to M23, and M29 to M32 disposed in the upper level and the external terminal 20 become long, signal quality of data may be reduced.

In this manner, the semiconductor module according to the present embodiment can not only prevent detachment of the chip parts of the termination resistors Rterm, but also can increase the signal quality of data input/output to/from the semiconductor chips disposed in the upper level.

Next, a method of optimizing a signal terminating function by the termination resistor Rterm will be explained.

As described above, at the wiring part 31, the termination resistor Rterm is connected not to the terminal part, but to the part branched from the wiring parts TL4 and TL6 connecting the semiconductor chips M1 and M2, and M19 and M20, respectively. Therefore, in order to correctly terminate signals by the termination resistor Rterm, an approach different from a normal one is required.

First, the position of the branching point B14 will be examined. The branching point B14 is an element which determines the lengths of the wiring part TL4 and the wiring part TL6, and a ratio of the wiring part TL4 and the wiring part TL6 is determined by the position thereof. Signal quality can be increased by designing the position of the branching point B14 so that the length of the wiring part TL6 becomes shorter than the wiring part TL4. In other words, it is preferred to satisfy below expression (1).

$$TL6 < TL4 \quad (1)$$

The branching point B14 is also an element which determines the length of the wiring part TL5 connected to the termination resistor Rterm. The wiring part TL5 is preferred to be short and, specifically, is preferred to be shorter than the total length of the wiring parts TL4 and TL6. In other words, it is preferred to satisfy a below expression (2).

$$TL5 < TL4 + TL6 \quad (2)$$

The resistance value of the termination resistor Rterm is preferred to be designed in consideration of the inductance of the wiring parts TL4 to TL6. In this case, the wiring parts TL4 and TL6 are branched from the branching point B14 when viewed from the termination resistor Rterm. Therefore, the influence of each of them can be estimated to be half. Furthermore, the resistance value of the termination resistor Rterm is preferred to be designed in consideration of the input capacitance of the closest semiconductor chips M1, M2, M19, and M20 and the capacitance of the wiring, parts TL2 connected thereto in addition to the capacitance of the wiring parts TL4 to TL6. Specifically, the resistance value of the termination resistor Rterm is preferred to satisfy a below expression (3).

$$Rterm \cong \sqrt{\frac{Lo \times TL5 + (Li \times TL4)/2 + (Li \times TL6)/2}{Co \times TL5 + Ci \times TL6 + Ci \times TL4 + 4 \times Co \times TL2 + 4 \times C\_pkg}} \quad (3)$$

In the expression (3), Lo represents the inductance per unit length of the wiring part positioned in the surface layer, and Li represents the inductance per unit length of the wiring part positioned in the inner layer. Co represents the capacitance per unit length of the wiring part positioned in the surface layer, and Ci represents the capacitance per unit length of the wiring part positioned in the inner layer. C_pkg represents the input capacitance of the semiconductor chip.

Hereinafter, evaluation results according to simulations will be explained.

Figure 18:
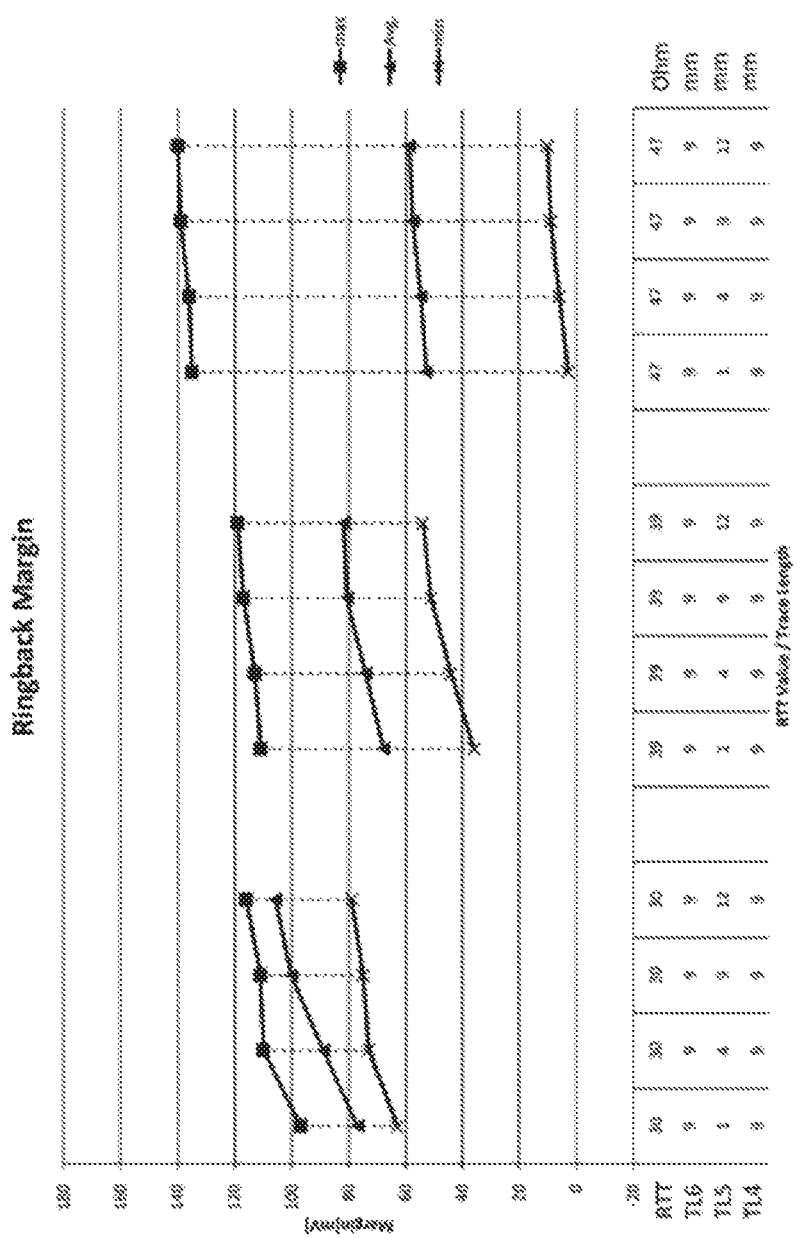
FIG. 18 is a graph showing simulation results of ringback margins.
Figure 19:
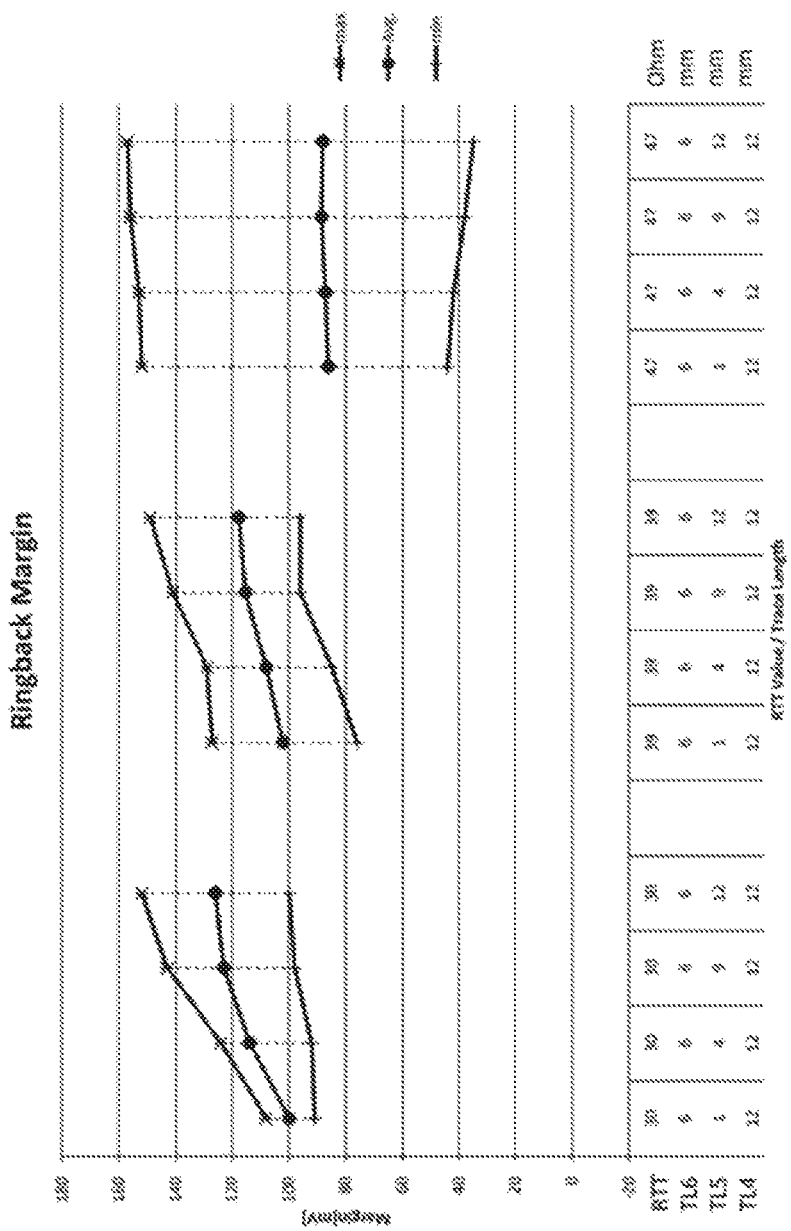
FIG. 19 is a graph showing simulation results of ringback margins.

FIG. 18 and FIG. 19 are simulation results showing ringback margins of the cases in which the lengths of TL4 to TL6 are variously varied when TL4+TL6=18 mm. Herein, FIG. 18 shows the case in which TL4=TL6=9 mm, and FIG. 19 shows the case in which TL4=12 mm and TL6=6 mm. As shown in FIG. 18 and FIG. 19, it can be understood that, when the length of the wiring part TL5 and the resistance value Rterm are the same, larger ringback margins are obtained by the condition (TL6<TL4) shown in FIG. 19 than by the condition (TL4=TL6) shown in FIG. 18. In other words, it can be understood that the ringback margins are increased when the expression (1) is satisfied.

Figure 20:
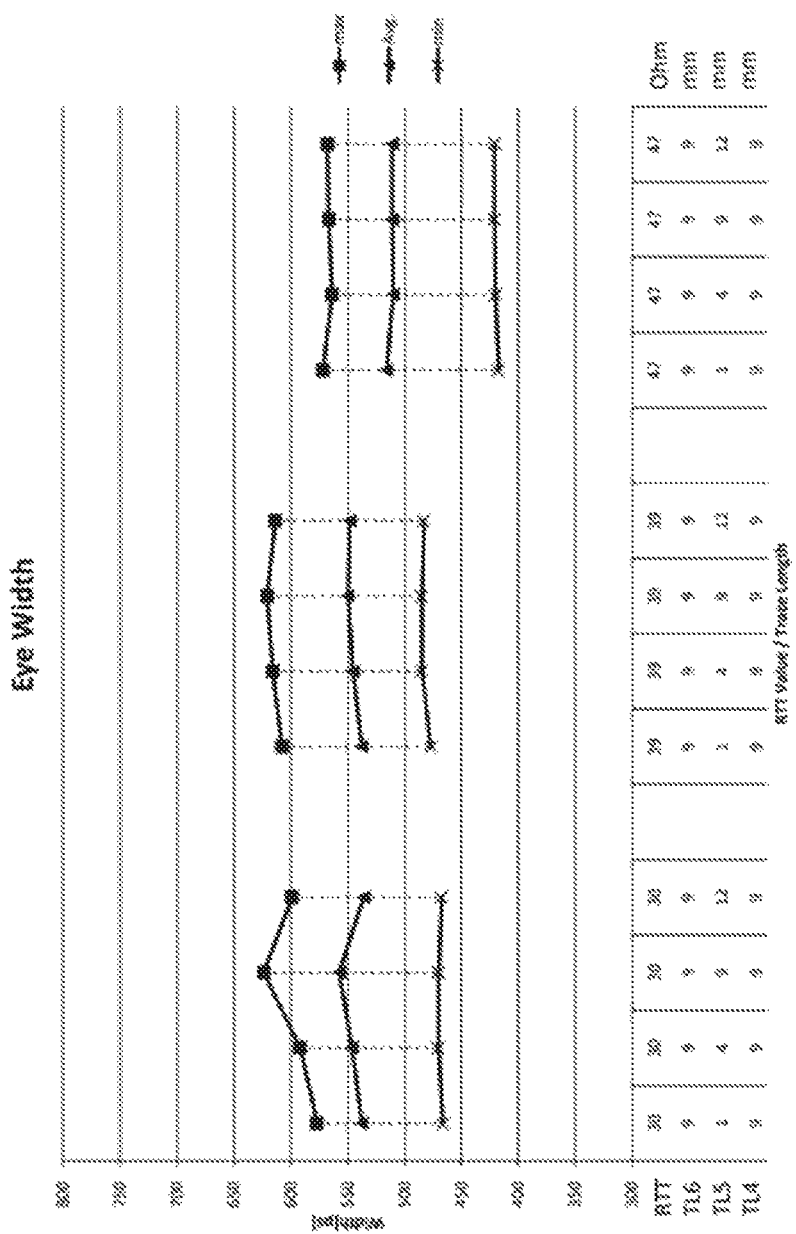
FIG. 20 is a graph showing simulation results of eye widths.
Figure 21:
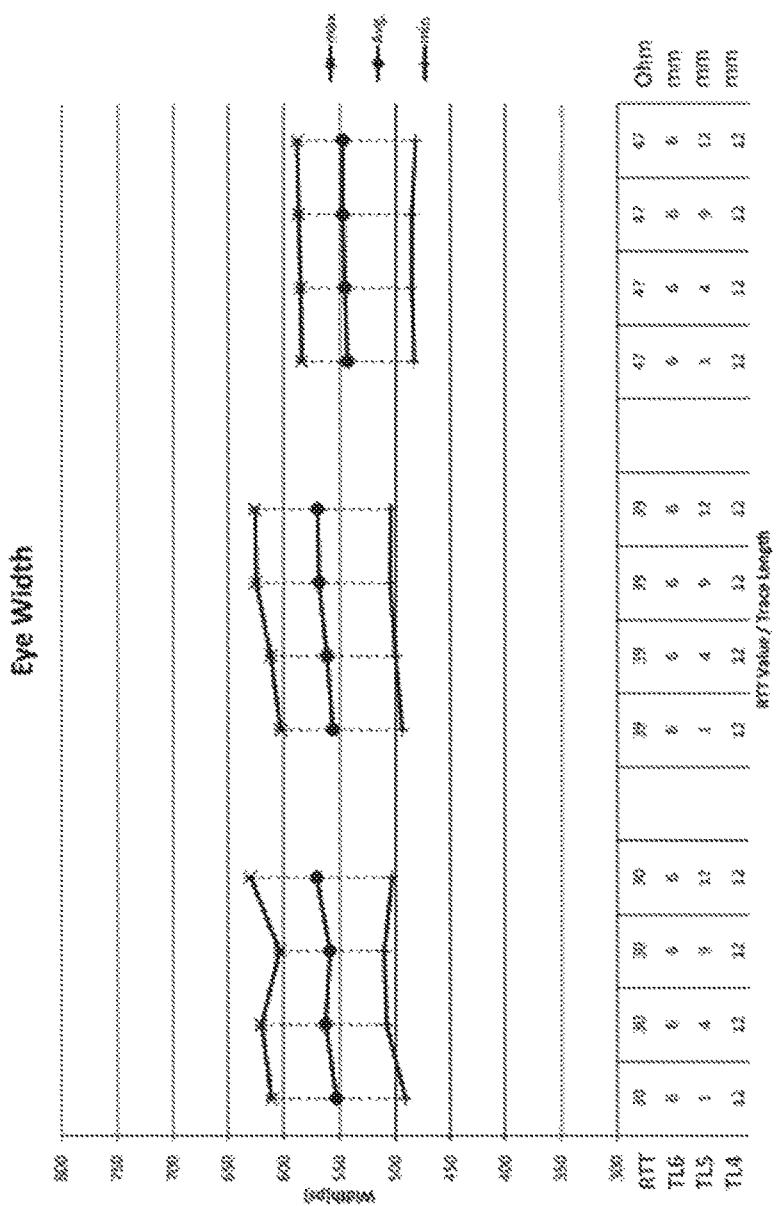
FIG. 21 is a graph showing simulation results of eye widths.

FIG. 20 and FIG. 21 show simulation results showing eye widths (Eye Width) of the case in which the lengths of TL4 to TL6 are variously varied when TL4+TL6=18 mm. Herein, FIG. 20 shows the case of TL4=TL6=9 mm, and FIG. 21 shows the case of TL4=12 mm and TL6=6 mm. As shown in FIG. 20 and FIG. 21, it can be understood that, when the length of the wiring part TL5 and the resistance value Rterm are the same, larger eye widths are obtained by the condition (TL6<TL4) shown in FIG. 21 than by the condition (TL4=TL6) shown in FIG. 20. In other words, it can be understood that the eye widths are increased when the expression (1) is satisfied.

Figure 22:
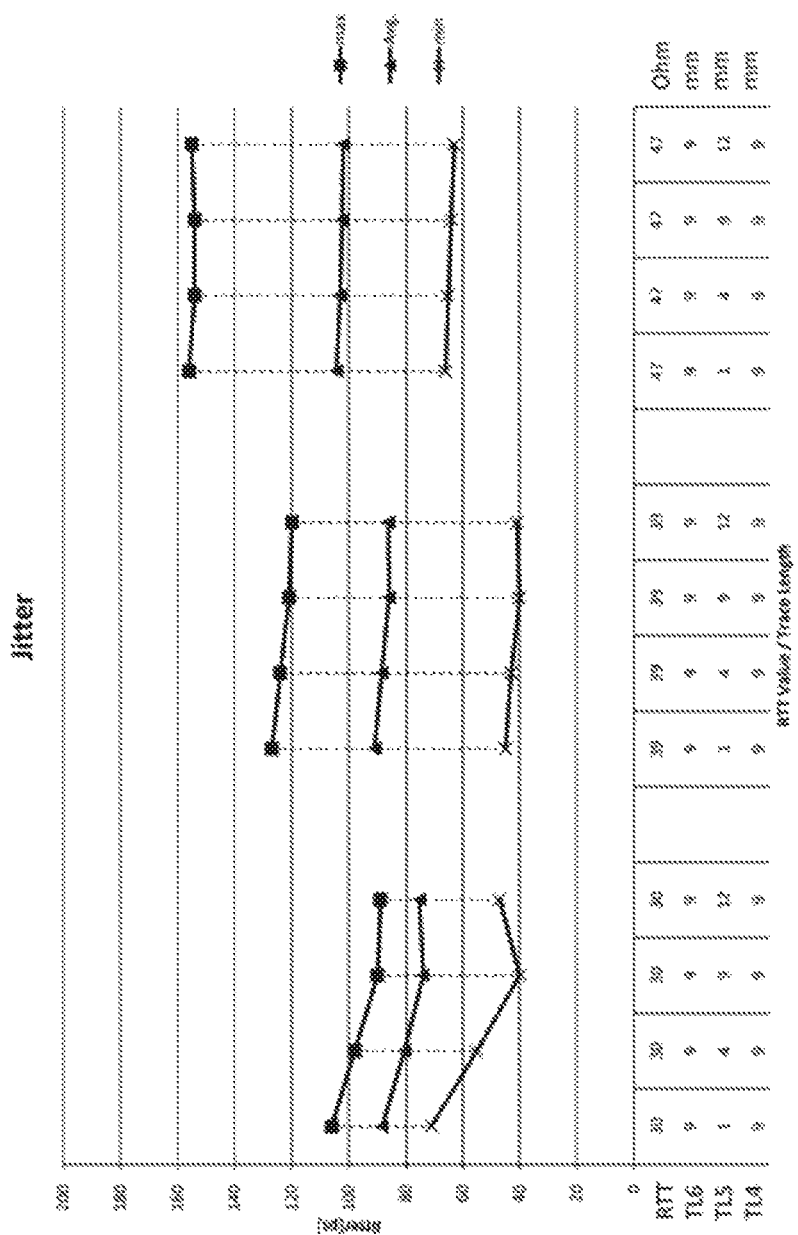
FIG. 22 is a graph showing simulation results of jitter.
Figure 23:
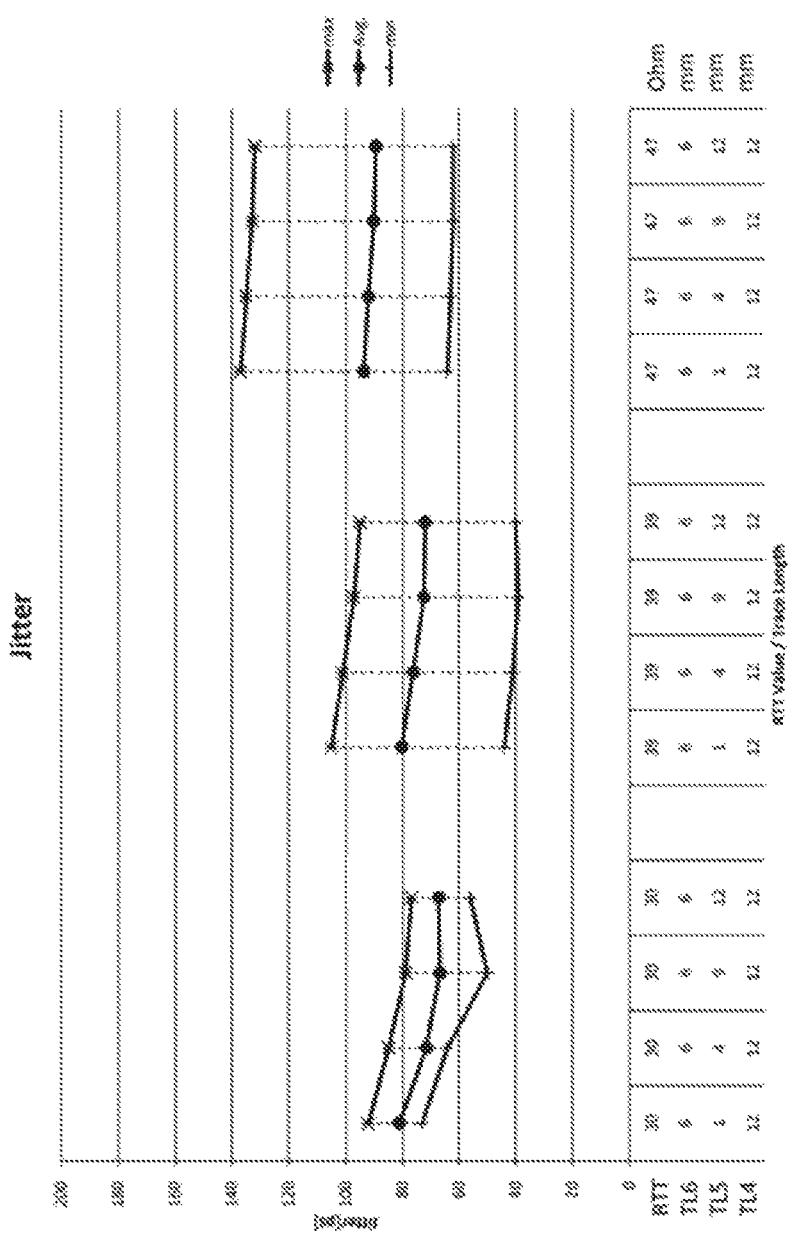
FIG. 23 is a graph showing simulation results of jitter.

FIG. 22 and FIG. 23 are simulation results showing jitter of the cases in which the lengths of the TL4 to T6 are variously varied when TL4+T16=18 mm. Herein, FIG. 22 shows the case in which TL4=TL6=9 mm, and FIG. 23 shows the case in which TL4=12 mm and TL6=6 mm. As shown in FIG. 22 and FIG. 23, it can be understood that when the length of the wiring part TL5 and the resistance value Rterm are the same, smaller jitter is obtained by the condition (TL6<TL4) shown in FIG. 23 than by the condition (TL4=TL6) shown in FIG. 22. In other words, it can be understood that jitter can be reduced when the expression (1) is satisfied.

Figure 24:
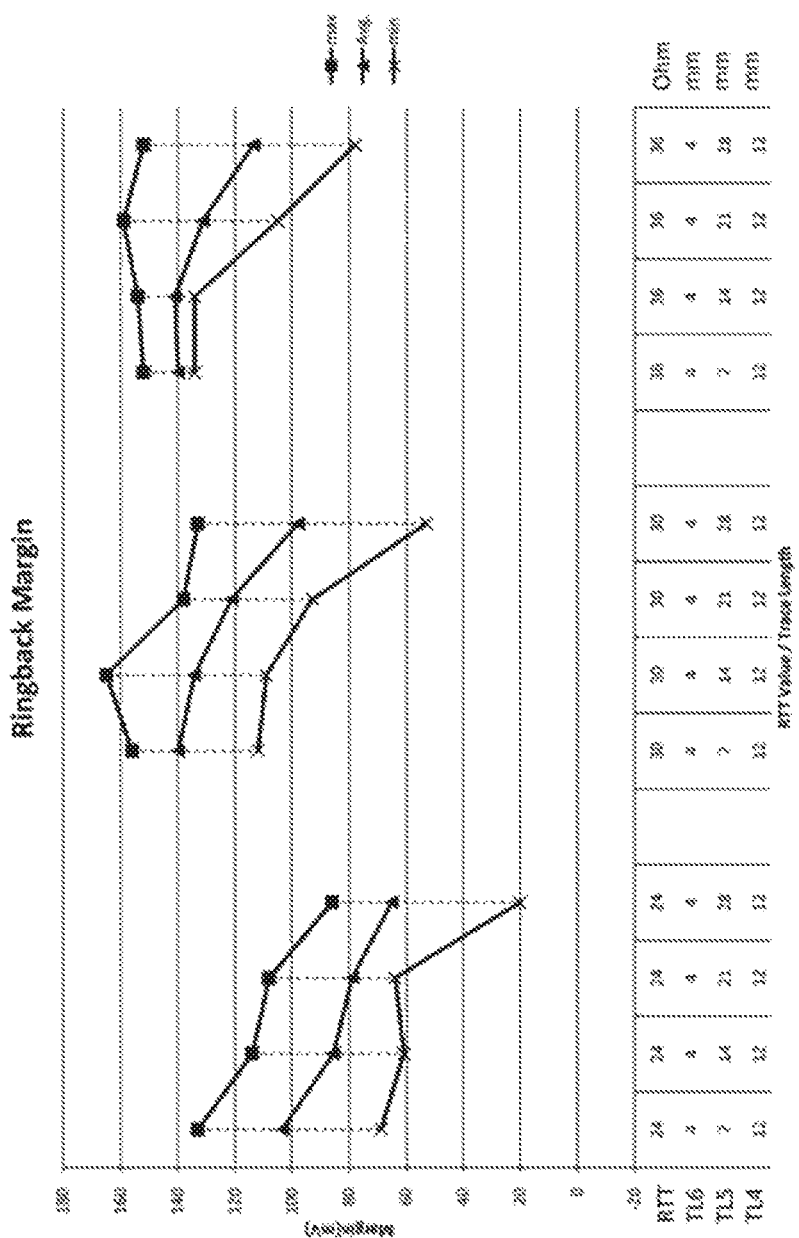
FIG. 24 is a graph showing simulation results of ringback margins.

FIG. 24 shows simulation results showing ringback margins of the cases in which the length of TL5 is variously varied when TL4=12 mm and TL6=4 mm. As shown in FIG. 24, it can be understood that, when the resistance value Rterm is the same, larger ringback margins are obtained when the condition of TL5<TL4+TL6 is satisfied than the case of TL5>TL4+TL6. In other words, it can be understood that the ring back margins are increased when the expression (2) is satisfied.

Figure 25:
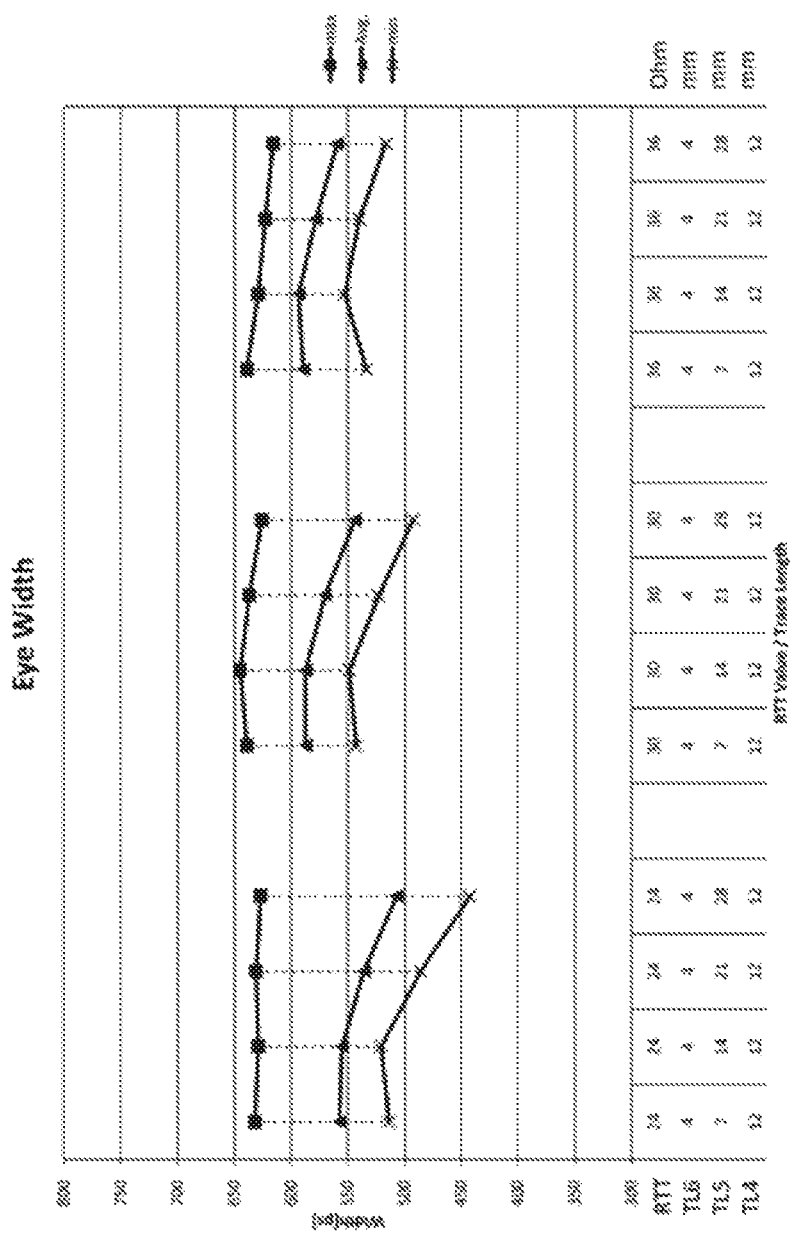
FIG. 25 is a graph showing simulation results of eye widths.

FIG. 25 shows simulation results showing eye widths of the cases in which the length of TL5 is variously varied when TL4=12 mm and TL6=4 mm. As shown in FIG. 25, it can be understood that, when the resistance Value Rterm is the same, larger eye widths are obtained when the condition of TL5<TL4+TL6 is satisfied than the case of TL5>TL4+TL6. In other words, it can be understood that the eye widths are increased when the expression (2) is satisfied.

Figure 26:
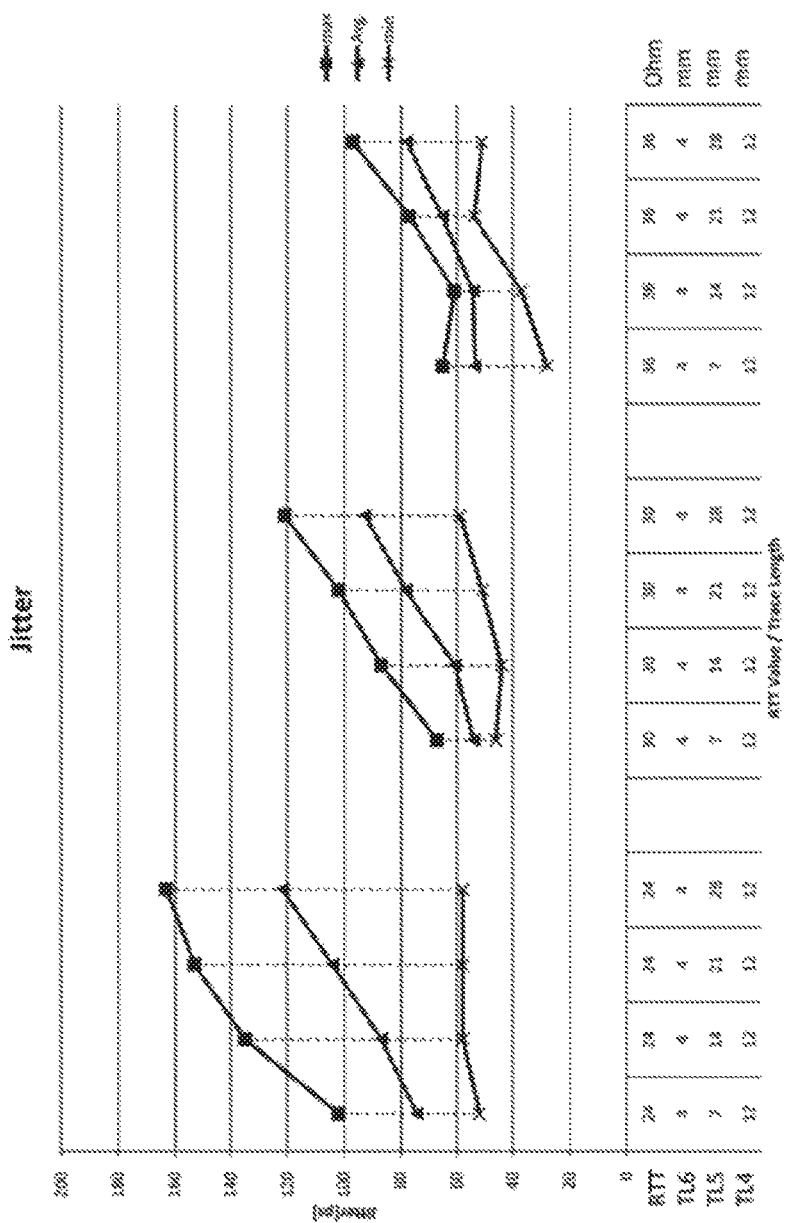
FIG. 26 is a graph showing simulation results of jitter.

FIG. 26 shows simulation results showing jitter of the cases in which the length of TL5 is variously varied when TL4=12 mm and TL6=4 mm. As shown in FIG. 26, it can be understood that, when the resistance value Rterm is the same, smaller jitter is obtained when the condition of TL5<TL4+TL6 is satisfied than the case of TL5>TL4+TL6. In other words, it can be understood that jitter is reduced when the expression (2) is satisfied.

Figure 27:
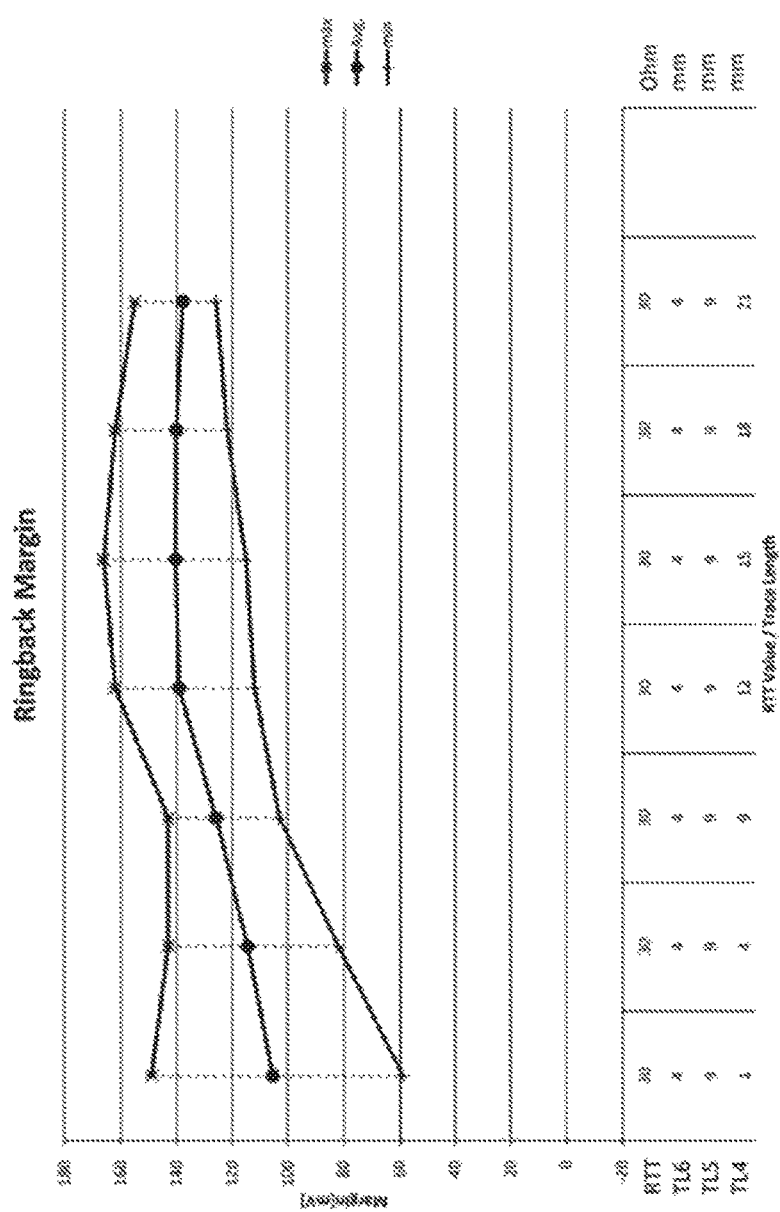
FIG. 27 is a graph showing simulation results of ringback margins.

FIG. 27 shows simulation results showing ring back margins of the cases which the length of TL4 is variously varied when TL5=9 mm, TL6=4 mm, and Rterm=30Ω. As shown in FIG. 27 it can be understood that, when the conditions of TL6<TL4 and TL5<TL4+TL6 are satisfied, larger ringback margins are obtained compared with the case in which these conditions are not satisfied. In other words, it can be understood that the ringback margins are increased when the expressions (1) and (2) are satisfied.

Figure 28:
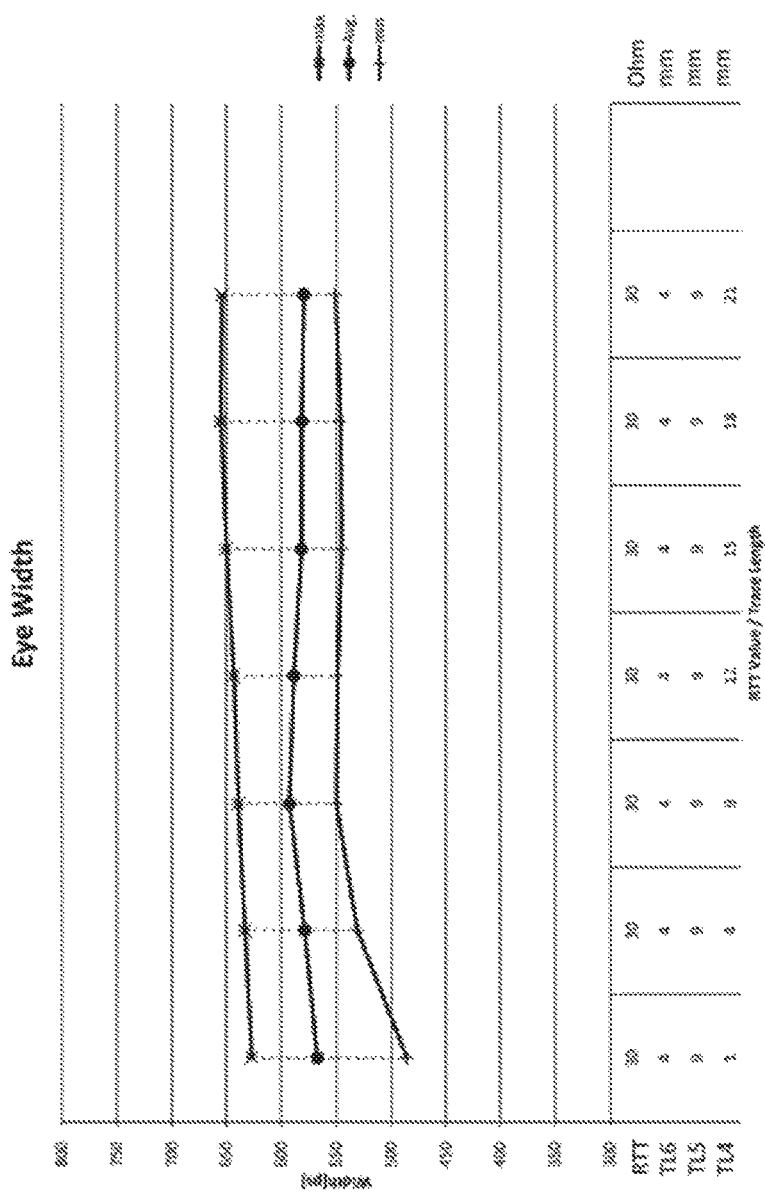
FIG. 28 is a graph showing simulation results of eye widths.

FIG. 28 shows simulation results showing eye widths of the cases in which the length of TL4 is variously varied when TL5=9 mm, TL6=4 mm, and Rterm=30Ω. As shown in FIG. 28, it can be understood that larger eye widths are obtained when the conditions of TL6<TL4 and TL5<TL4+TL6 are satisfied compared with the case in which these conditions are not satisfied. In other words, it can be understood that the eye widths are increased when the expressions (1) and (2) are satisfied.

Figure 29:
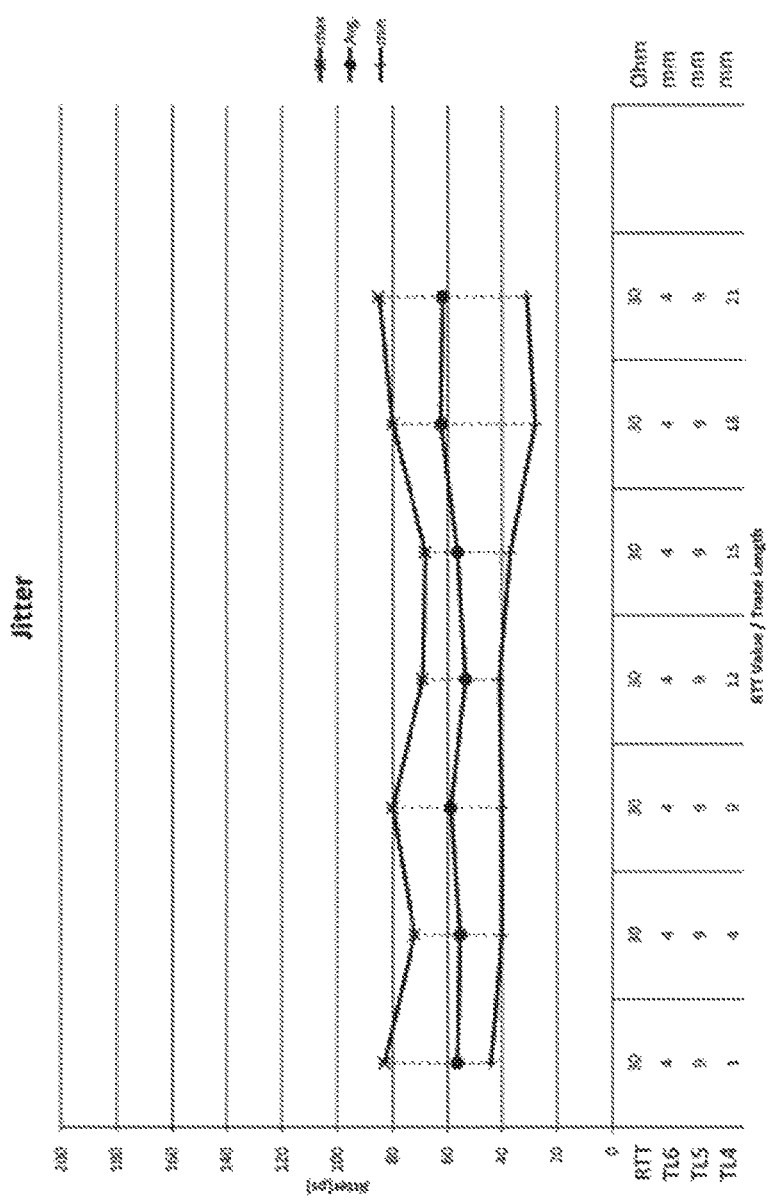
FIG. 29 is a graph showing simulation results of jitter.

FIG. 29 shows simulation results showing jitter of the case in which the length of TL4 is variously varied when TL5=9 mm, TL6=4 mm, and Rterm=30Ω. As shown in FIG. 29, it can be understood that smaller jitter is obtained glen the conditions of TL6<T14 and TL5<TL4+TL6 are satisfied compared with the case in which these conditions are not satisfied. In other words, it can be understood that jitter is reduced when the expressions (1) and (2) are satisfied.

Figures 30A, 30B:
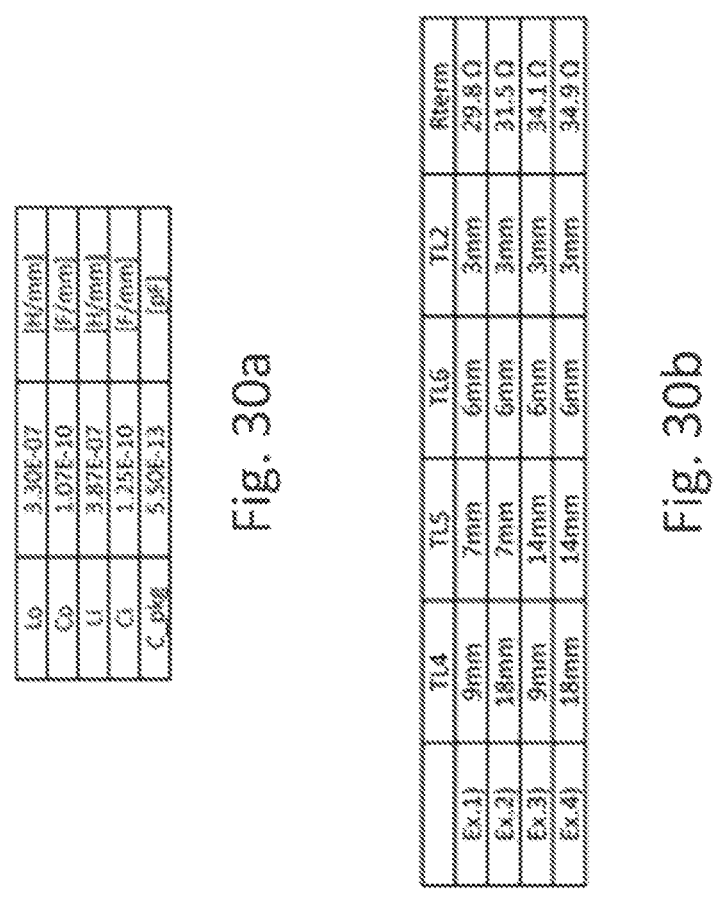

FIG. 30a is a table showing an example of parameters for calculating an optimum resistance value of the termination resistor Rterm. In a case in which the parameters shown in FIG. 30a are used, when the lengths of the wiring parts TL2 and TL4 to TL6 are substituted into the expression (3), the value of the obtained resistance value Rterm becomes as shown in FIG. 30b.

Figure 31:
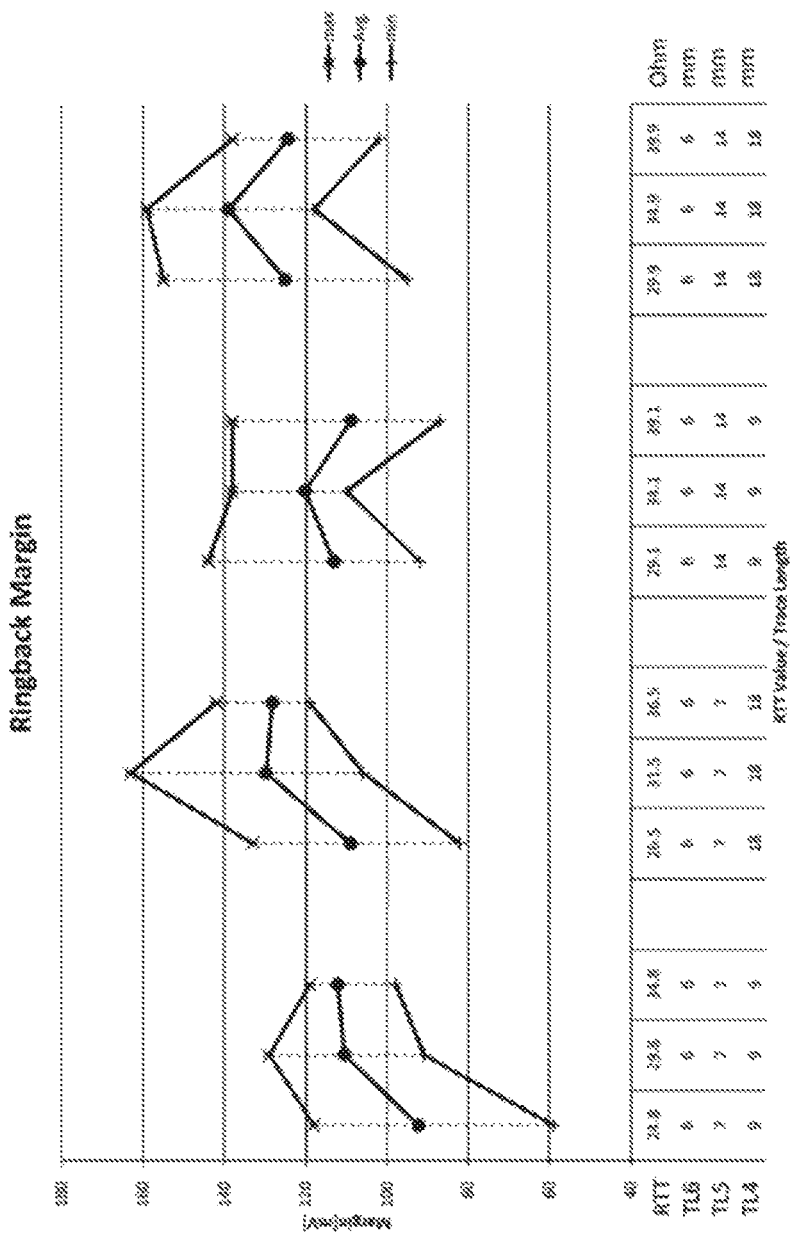
FIG. 31 is a graph showing simulation results of ringback margins.

FIG. 31 shows simulation results showing ringback margins of the cases of the resistance value of the termination resistor Rterm obtained by the expression (3) and those varied by ±5Ω under the conditions of Example 1 to Example 4 shown in FIG. 30b. As shown in FIG. 31, it can be understood that, when the resistance value of the termination resistor Rterm is set to the value obtained by the expression (3) under all of the conditions of Example 1 to Example 4, larger ringback margins are obtained compared with the cases in which the resistance value is varied by ±5Ω. In other words, it can be understood that, when the resistance value of the termination resistor Rterm is set to the resistance value obtained by the expression (3), the ringback margins are increased.

Figure 32:
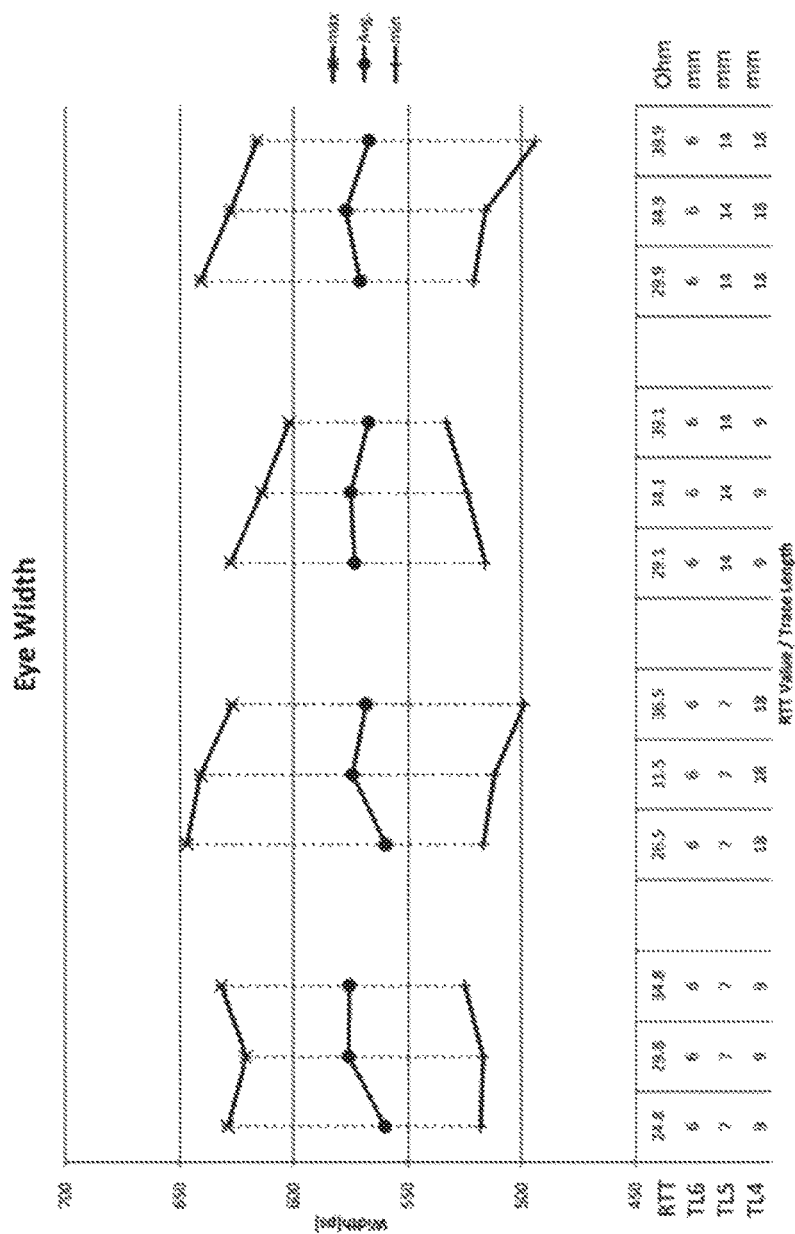
FIG. 32 is a graph showing simulation results of eye widths.

FIG. 32 shows simulation results showing eye widths of the cases of the resistance value of the termination resistor Rterm obtained by the expression (3) and those varied by ±5Ω under the conditions of Example 1 to Example 4 shown in FIG. 30b. As shown in FIG. 32 it can be understood that, when the resistance value of the termination resistor Rterm is set to the value obtained by the expression (3) under all of the conditions of Example 1 to Example 4, larger eye widths are obtained compared with the cases in which the resistance value is varied by ±5Ω. In other words, it can be understood that the eye widths are increased when the resistance value of the termination resistor Rterm is set to the resistance value obtained by the expression (3).

Figure 33:
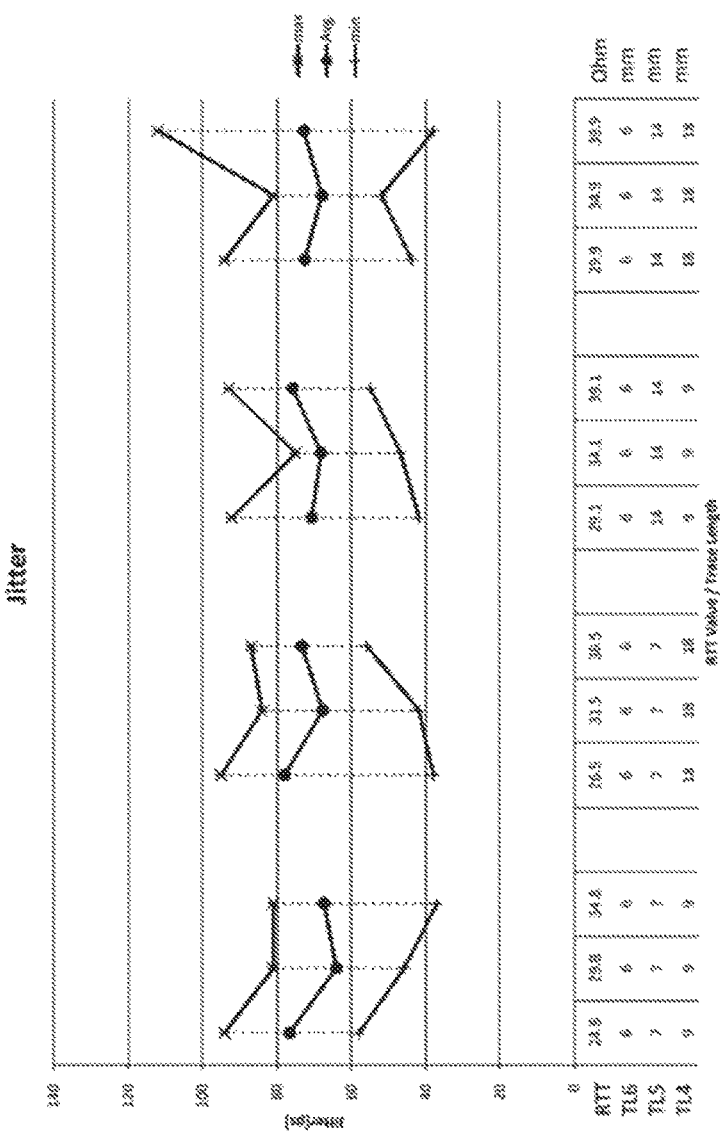
FIG. 33 is a graph showing simulation results of jitter.

FIG. 33 shows simulation results showing jitter of the cases of the resistance value of the termination resistor Rterm obtained by the expression (3) and those varied by ±5Ω under the conditions of Example 1 to Example 4 shown in FIG. 30b. As shown in FIG. 33, it can be understood that, when the resistance value of the termination resistor Rterm is set to the value obtained by the expression (3) under all of the conditions of Example 1 to Example 4, smaller jitter is obtained compared with the case in which the resistance value is varied by ±5Ω. In other words, it call be understood that, when the resistance value of the termination resistor Rterm is set to the resistance value obtained by the expression (3), jitter is reduced.

Hereinabove, the preferred embodiment of the present invention has been explained. However, the present invention is not limited to the above described embodiment, various modifications can be made within the range not departing from the gist of the present invention, and it goes without saying that they are also included in the range of the present invention.

For example, the above described embodiment has been explained by taking, as an example, the case in which the present invention is applied to a memory module; however, the application targets of the present invention are not limited thereto. Moreover, even if the present invention is applied to a memory module, the mounted memory devices are not limited to DRAMs.

What is claimed is:
1. A memory module comprising:
  a module substrate;
  a first plurality of memory chips mounted on the module substrate, the first plurality of memory chips including:
    a first memory chip;
    a second memory chip; and
    a group of third memory chips, wherein the second memory chip is arranged between the first memory chip and the group of third memory chips;
  a first line pattern provided on the module substrate, the first line pattern extending along the first plurality of memory chips, the first line pattern including:
    a first branching point coupled to the first memory chip;
    a second branching point coupled to the second memory chip;
    a group of third branching points coupled respectively to the group of third memory chips, wherein the second branching point is arranged between the first branching point and the group of the third branching points; and
    a fourth branching point arranged between the first branching point and the second branching point; and
  a first termination resistor arranged between the first memory chip and the second memory chip and mounted on the module substrate, the first termination resistor including a first end coupled to a terminal power source and a second end,
wherein the fourth branching point is coupled to the second end of the first termination resistor.

2. The memory module, of claim 1, further comprising a register chip mounted the module substrate, the register chip being coupled to the first line pattern.

3. The memory module of claim 2, wherein the group of third memory chips are disposed between the second memory chip and the register chip.

4. The memory module of claim 3, wherein the first plurality of memory chips, the first termination resistor and the register chip are arranged in line.

5. The memory module of claim 1, wherein the module substrate includes a first principal surface and a second principal surface opposite to the first principal surface;
wherein the first plurality of memory chips and the first termination resistor are mounted on the first principal surface of the module substrate,
wherein the memory module further comprises a second plurality of memory chips mounted on the second principal surface of the module substrate, the second plurality of memory chips including:
a fourth memory chip coupled to the first branching point of the first line pattern;
a fifth memory chip coupled to the second branching point of the first line pattern; and
a group of sixth memory chips coupled respectively to group of the third branching points of the first line pattern, and
wherein the fifth memory chip is arranged between the fourth memory chip and the group of sixth memory chips.

6. The memory module of claim 5, further comprising a register chip mounted on the first principal surface of the module substrate and coupled to the first line pattern,
wherein the group of third memory chips are disposed between the second memory chip and the register chip.

7. The memory module of claim 6, wherein the first memory chip and the fourth memory chip are aligned in mounted position with intervention of the module substrate, wherein the second memory chip and the fifth memory chip are aligned in mounted position with intervention of the module substrate, and wherein the group of third memory chips and the group of sixth memory chips are aligned in mounted position with intervention of the module substrate, respectively.

8. The memory module of claim 7, further comprising a second termination resistor mounted on the second principal surface of the module substrate, the second termination resistor being arranged between the fourth memory chip and the fifth memory chip, the second termination resistor including a third end coupled to the terminal power source and a fourth end coupled to the fourth branching point of the first line pattern.

9. The memory module of claim 1, further comprising:
a second line pattern provided on the module substrate and coupled to the first line pattern, the second line pattern including:
a fifth branching point; and
a plurality of sixth branching points arranged between the first branching point and a coupling point of the first line pattern and the second line pattern;
a second plurality of memory chips mounted on the module substrate, the second plurality of memory chips being coupled respectively to the plurality of sixth branching points of the second line pattern; and
a second termination resistor mounted on the module substrate, the second termination resistor including:
a third end coupled to the terminal power source; and
a fourth end coupled to the fifth branching point of the second line pattern.

10. The memory module of claim 9, further comprising a register chip mounted on the module substrate, the register chip being coupled to the coupling point of the first line pattern and the second line pattern.

11. The memory module of claim 10, wherein the group of third memory chips are disposed between the second memory chip and the register chip;
wherein the module substrate includes a first side edge and a second side edge, wherein a width of the module substrate is a distance between the first side edge and the second side edge,
wherein the register chip, the first termination resistor and the first plurality of memory chips are arranged in line along the first side edge of the module substrate, and
wherein the second plurality of memory chips are arranged in line along the second side edge of the module substrate.

12. The memory module of claim 11, wherein the second plurality of memory chips includes:
a fourth memory chip; and
a group of fifth memory chips arranged between the fourth memory chip and the register chip, and
wherein the second termination resistor is arranged between the second side edge and the fourth memory chip.

13. The memory chip of claim 12, further comprising a plurality of external terminals provided on the module substrate between the second termination resistor and the second side edge.

14. The memory chip of claim 12, wherein the module substrate further includes a third side edge intersecting each of the first side edge and the second side edge,
wherein the first memory chip and the fourth memory chip are arranged along the third side edge.

15. A memory module comprising:
a module substrate;
a line pattern provided on the module substrate, the line pattern including:
a first branching point;
a second branching point; and
a third branching point;
a first partial line pattern extending from the first branching point to the second branching point, wherein the first partial line pattern includes:
a fourth branching point; and
a fifth branching point between the fourth branching point and the first branching point, wherein the fourth branching point is being between the second branching point and the fifth branching point; and
a second partial hue pattern extending from the first branching point to the third branching point, the second partial line pattern including:
a sixth branching point; and
a seventh branching point between the sixth branching point and the first branching point, wherein the sixth branching point is being between the third branching point and the seventh branching point;
a first memory chip mounted on the module substrate and coupled to the second branching point;
a second memory chip mourned on the module substrate and coupled to the fifth branching point;

a first termination resistor mounted on the module substrate between the first memory chip and the second memory chip and coupled to the fourth branching point;
a second termination resistor mounted on the module substrate and coupled to the third branching point;
a third memory chip mounted on the module substrate and coupled to the sixth branching point; and
a fourth memory chip mounted on the module substrate and coupled to the seventh branching point.

16. The memory module of claim 15, further comprising a register chip mounted on the module substrate and coupled to the first branching point.

17. The memory module of claim 16, wherein the first memory chip, the first termination resistor, the second memory chip and the register chip are aligned along a first line, and the third memory chip and the fourth memory chip are aligned along a second line substantially parallel to the first line.

18. The memory module of claim 15,
wherein the first partial line pattern further includes at least one eighth branching point between the fifth branching point and the first branching point,
wherein the second partial line pattern further includes at least one ninth branching point between the seventh branching point and the first branching point, and
wherein the memory module further comprises:
at least one fifth memory chip mounted on the module substrate and coupled to the at least one eighth branching point; and
at least one sixth memory chip mounted on the module substrate and coupled to the at least one ninth branching point.

19. The memory module of claim 15,
wherein the module substrate includes:
a first side edge;
a second side edge parallel to the first side edge; and
a third side edge intersecting the first side edge to form a first corner, the third side edge further intersecting the second side edge to form a second corner,
wherein the first memory chip is closer to the first corner than the second corner, and
wherein the sixth memory chip is closer to the second corner than the first corner.

20. The memory module of claim 19, wherein the second termination resistor is arranged between the sixth memory chip and the second side edge.

21. The memory module of claim 20, further comprising a plurality of external terminals mounted on the module substrate along the second side edge, the plurality of external terminals being arranged between the second termination resistor and the second side edge.

* * * * *